United States Patent [19]
Powell et al.

[11] Patent Number: 6,165,874
[45] Date of Patent: Dec. 26, 2000

[54] METHOD FOR GROWTH OF CRYSTAL SURFACES AND GROWTH OF HETEROEPITAXIAL SINGLE CRYSTAL FILMS THEREON

[75] Inventors: J. Anthony Powell, North Olmsted; David J. Larkin, Valley City; Philip G. Neudeck, Olmsted Falls; Lawrence G. Matus, Amherst, all of Ohio

[73] Assignee: The United States of America as represented by the Administrator of the National Aeronautics and Space Administration, Washington, D.C.

[21] Appl. No.: 09/252,623

[22] Filed: Dec. 16, 1998

Related U.S. Application Data

[63] Continuation-in-part of application No. 08/887,804, Jul. 3, 1997, Pat. No. 5,915,194.

[51] Int. Cl.$^7$ .................................................. H01L 21/306
[52] U.S. Cl. .......................................... 438/478; 438/931
[58] Field of Search .................................... 438/607, 478, 438/503, 504, 931, 483; 117/95, 101, 105, 106

[56] References Cited

U.S. PATENT DOCUMENTS

| | | | |
|---|---|---|---|
| 5,248,385 | 9/1993 | Powell | 156/645 |
| 5,363,800 | 11/1994 | Larkin et al. | 117/95 |
| 5,463,978 | 11/1995 | Larkin et al. | 117/89 |
| 5,714,006 | 2/1998 | Kizuki et al. | 117/89 |
| 5,915,194 | 6/1999 | Powell et al. | 438/478 |

OTHER PUBLICATIONS

Gerald B. Stringfellow, "Organometallic Vapor–Phase Epitaxy: Theory and Practice" Academic Press, Inc., New York (1989), Chapters 1 and 7 thereof.

H. Morkoc, S. Strite, G.B. Gao, Mi. Lin, B. Sverdlov, and M. Burns, "Large–Band–Gap SiC, III–V Nitride, and II–BI ZnSe–Based–Semiconductor Device Technologies" J. Appl. Phys, vol. 76, No. 3, Aug. 1 1994 (pp. 1363–1398).

Sorab K. Ghandhi "VLSI Fabrication Principles" John Wiley & Sons, New York (1983), Sections 5.1 and 5.3.

J. Bloem and L.J. Giling, "Current Topics in Materials Science," vol. 1 Edited by E. Kaldis, North–Holland Publishing Co., New York (1978), Chapter 4, "Mechanisms of the Chemical Vapour Depositions of Silicon," Section 7.

H. Liu et al "Large Area Growth of GaN Thin Films in a Multi–Wafer Rotating Disk Reactor," Inst. Phys. Conf. Ser. No. 141: Chapter 2, pp. 119–124, Paper presented at Int. Sump. Compound Semicond., San Diego Sep. 18–22, 1994 1995, IOP Publishing Ltd.

H. Jurgensen, "CVD Engineering for Multilayer Multicomponent Materials: Optoelectronics," Materials Chemistry and Physics 41 (1995) pp. 79–86.

Ralph E. Williams, "Gallium Arsenide Processing Techniques," ARTECH House, Inc., Dedham, MA, (pp. 79–83) (1984).

F. Ali and A. Gupta, "HEMTs and HBTs Devices, Fabrication, and Circuits," ARTECH House, Inc., Norwood, MA (Chapter 1 pp. 1–10) (1991).

D.K. Schroder, "Advanced MOS Devices" Modular Series on Solid State Devices, edited by G.W. Neudeck and R.F. Pierret, Addison–Wesley Publishing Company, Reading, Mass., (pp. 204–208) (1987).

R.C. Jaeger "Volume V Introduction to Microelectronic Fabrication," Modular Series on Solid State Devices, edited by G.W. Neudeck and R.F. Pierret, Addison–Wesley Publishing Company, Reading, Mass., (pp. 6–9) (1998).

S.M. Sze, "Physics of Semiconductor Devices," (Second Edition) John Wiley & Sons, New York, New York (Chapter 8 pp. 431–510) (1981).

*Primary Examiner*—Richard Elms
*Assistant Examiner*—Bradley K. Smith

[57] ABSTRACT

A method of growing atomically-flat surfaces and high quality low-defect crystal films of semiconductor materials and fabricating improved devices thereon. The method is also suitable for growing films heteroepitaxially on substrates that are different than the film. The method is particularly suited for growth of elemental semiconductors (such as Si), compounds of Groups III and V elements of the Periodic Table (such as GaN), and compounds and alloys of Group IV elements of the Periodic Table (such as SiC).

17 Claims, 8 Drawing Sheets

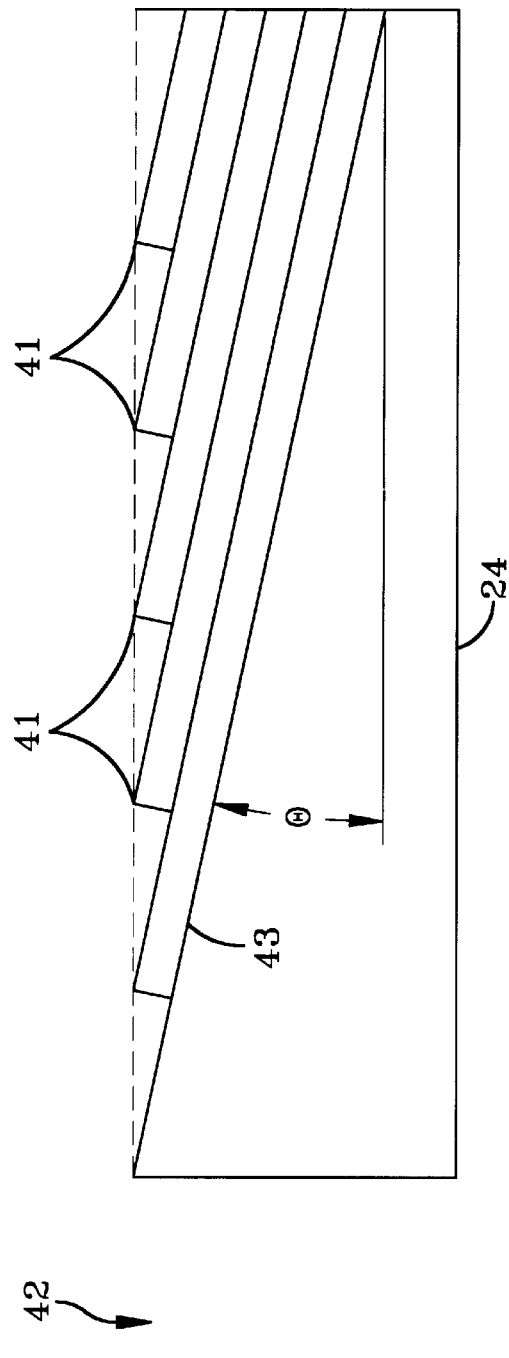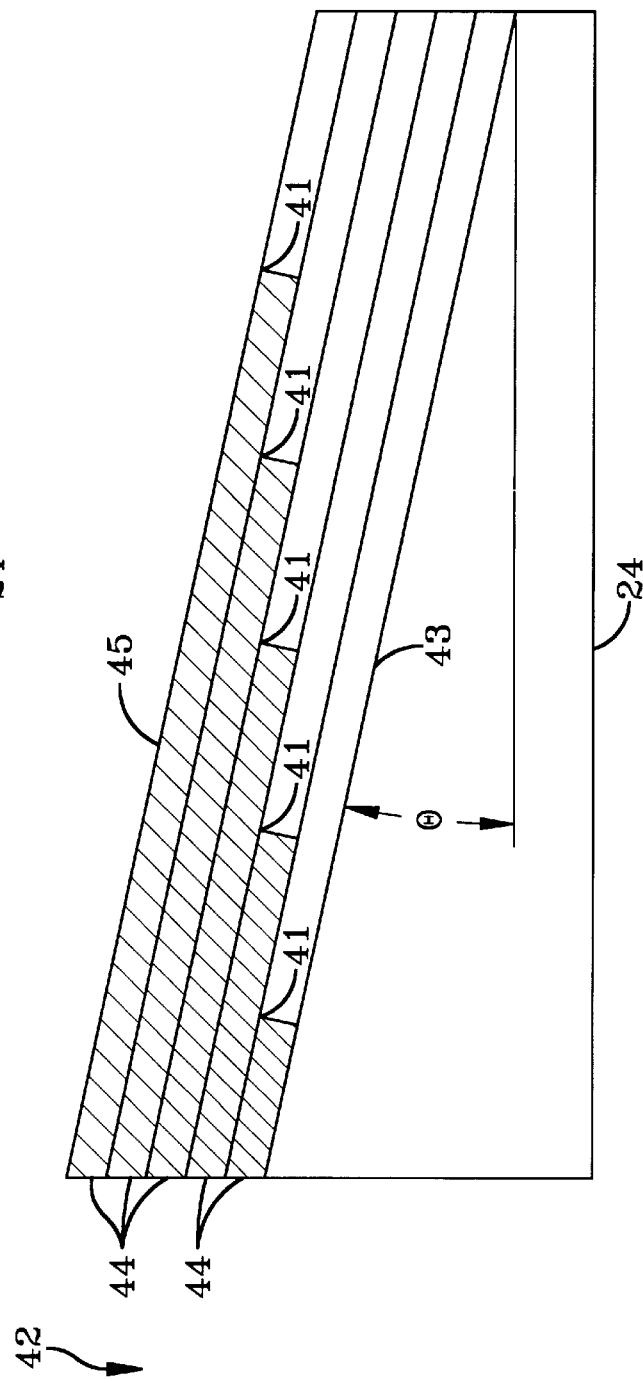

METHOD FOR GROWTH OF CRYSTAL SURFACES AND GROWTH OF HETEROEPITAXIAL SINGLE CRYSTAL FILMS THEREON

CROSS-REFERENCE TO RELATED APPLICATIONS

This application is a continuation-in-part of U.S. patent application Ser. No. 08/887,804 filed Jul. 3, 1997 now U.S. Pat. No. 5,915,194.

ORIGIN OF THE INVENTION 0

The invention described herein was made by employees of the United States Government and may be used by or for the Government for governmental purposes without payment of any royalties thereon or therefor.

FIELD OF THE INVENTION

The invention relates to the growth of semiconductor device crystal films, and more particularly, to a method for producing atomically-flat crystalline surfaces and high-quality films of silicon carbide (SiC), aluminum nitride (AlN), gallium nitride (GaN), and other materials or compounds. The semiconductor devices find application in high power, high frequency, high temperature and high radiation environments, as well as use in optoelectronic devices such as lasers and light-emitting diodes.

BACKGROUND OF THE INVENTION

This invention relates to the controlled growth of atomically-flat crystalline surfaces and crystal films for application to the fabrication of semiconductor devices. The invention is particularly applicable to the production of crystals (herein used to include crystal films) of silicon carbide, aluminum nitride, gallium nitride, and other compounds. A primary aspect of the invention is related to silicon (Si), silicon carbide (SiC), and nitrides (e.g., AlN and GaN) of the Group III–V elements of the Periodic Table; however, the invention has much broader applications and can be used for other materials such as other elemental semiconductors, compounds and alloys of the Group IV elements of the Periodic Table, and other compounds of the Group III and Group V elements of the Periodic Table. For example, alloys of silicon and germanium, and films of ternary and quaternary compounds (and higher order compounds) of the III–V elements are of importance to the present invention.

Semiconductors of the compounds formed from elemental semiconductors, compounds of Group III and Group V elements of the Periodic Table and compounds and alloys of the Group IV elements of the Periodic Table have been grown and used for many years. Examples of the III–V compounds are GaAs and GaP. Their properties and procedures of crystal growth are known to those skilled in the art. A reference book that describes in detail the epitaxial growth of III–V compounds is: "Organometallic Vapor-Phase Epitaxy: Theory and Practice" by Gerald B. Stringfellow, published in Academic Press, Inc. New York (1989). In Chapter 1 of this book, an overview of epitaxial growth processes is given. Primarily, organometallic vapor phase epitaxy (OMVPE) is used to for the growth of III–V compounds. In Chapter 7 of this book, information on specific compounds given, that is, growth of binary compounds (e.g., GaAs, GaP, GaN, etc.), ternary compounds (e.g., AlGaAs, etc.), and quaternary compounds (e.g., AlGaInP, etc.) is described. The subject matter of both Chapters 1 and 7 of this reference book is herein incorporated by reference.

The semiconductor compounds of SiC and of the nitrides (GaN, AlN, and InN) are further described in the technical article, "Large-band-gap SiC, III–V nitride, and II-BI ZnSe-Based Semiconductor Device Technologies" by H. Morkoc, S. Strite, G. B. Gao, Mi. Lin, B. Sverdlov, and M. Burns, published in J. Appl. Phys. vol. 76, no. 3, Aug. 1, 1994 (pp. 1363–1398). This technical article gives details of the properties (p. 1378, 1380) and epitaxial growth (1380–1382) of the III-nitrides. A schematic diagram of a CVD reactor for growing GaN is given in FIG. 30 thereof. Also, benefits (commercial applications) of these materials is more fully described on p. 1364 thereof. The subject matter of this technical article of H. Morkoc et al is herein incorporated by reference.

The epitaxial growth of the elements and compounds related to the present invention, such as Si and GaAs may be accomplished by techniques known in the art, such as those disclosed in the publication entitled "VLSI Fabrication Principles" by Sorab K. Ghandhi, published in John Wiley & Sons, New York (1983). Section 5.1 of this publication describes various phases of vapor phase epitaxy, including various epitaxial reactor configurations that are used in the growth of Si and GaAs. These are examples of crystals with a cubic structure. Section 5.3 of this publication describes the growth of GaAs, including the effect of crystal orientation (Section 5.3.7). In particular, FIG. 5.19 shows the strong dependence of orientation on the growth rate which is of importance to the present invention. In this reference in Section 5.3.1, it is also pointed out that there is an inherent barrier to nucleation during growth in the <111> direction, which is not present in the <100> direction. Also it is pointed out in Section 5.3.2 that "Substrates must be extremely clean and free from mechanical damage prior to growth." The subject matter of Sections 5.1, 5.3, and 5.3.1 of this publication is herein incorporated by reference.

The orientation aspects related co growth of semiconductor compounds are known in the art and are described, for example in "Current Topics in Materials Science," Volume 1, edited by E. Kaldis, North-Holland Publishing Co., New York (1978); in particular, Chapter 4, "Mechanisms of the Chemical Vapour Deposition of Silicon," by J. Bloem and L. J. Giling; and, especially, in Section 7 thereof, "Nucleation." Section 7 in this publication describes the effect of crystal orientation on the nucleation and growth of Si on Si substrates. FIG. 7.2 (p. 261) of this publication shows that the growth rate is a minimum for the crystal face (111) because the nucleation rate is a minimum for this orientation which is of importance to the present invention.

In FIG. 7.8 (p. 267) of this publication, it is shown that nucleation can be reduced to zero by increasing the temperature to a selected value. This demonstrates that one of the mechanisms of the present invention, to be described, for SiC is also applicable for Si. FIG. 7.10 (p. 273) of this publication shows that the growth rate is a minimum on the (111) face of Si to be further described hereinafter. The subject matter of Section 7 of this publication is herein incorporated by reference.

The growth of semiconductor compounds such as GaN may be accomplished by various commercial available reactors, such as that disclosed in the technical article, "Large Area Growth of GaN Thin Films in a Multi-Wafer Rotating Disk Reactor," by H. Liu et al; Inst. Phys. Conf. Ser. No. 141: Chapter 2, pp 119–124, given in the paper presented at Int. Sump. Compound Semicond., San Diego Sep.

18–22, 1994 1995 IOP Publishing Ltd. The growth of many III–V compounds in a commercial reactor is disclosed in the technical article, "CVD Engineering for Multilayer Multicomponent Materials: Optoelectronics," by H. Jurgensen *Materials Chemistry and Physics* 41 (1995) pp. 79–86. The subject matter of both of the technical articles of H. Liu et al and H. Jurgensen is herein incorporated by reference.

The semiconductor compounds used for semiconductor devices have associated processes, structures and operation known in the art some of which are described in the following five (5) references entitled "Gallium Arsenide Processing Techniques" of Ralph E. Williams, ARTECH House, Inc., Dedham, Mass., (pp 79–83) (1984); "HEMTs and HBTs Devices, Fabrication, and Circuits" of F. Ali and A. Gupta, ARTECH House, Inc., Norwood, Mass., (chapter 1 pp 1–10) (1991); "Advanced MOS Devices" of D. K. Schroder, *MODULAR SERIES ON SOLID STATE DEVICES*, edited by G. W. Neudeck and R. F. Pierret, Addison-Wesley Publishing Company, Reading, Mass., (pp. 204–208) (1987); "Volume V Introduction to Microelectronic Fabrication" of R. C. Jaeger, *MODULAR SERIES ON SOLID STATE DEVICES*, edited by G. W. Neudeck and R. F. Pierret, Addison-Wesley Publishing Company, Reading, Mass., (pp 6–9) (1998); and "Physics of Semiconductor Devices" (Second Edition) of S. M. Sze, (Chapter 8, pp. 431–510) John Wiley & Sons, New York, N.Y. (1981); all of which five (5) references are herein incorporated by reference.

The invention is also particularly applicable to growing atomically-flat surfaces. The ability to prepare device-sized regions of atomically-flat, or nearly atomically-flat, regions on a semiconductor crystal leads to improved performance and reliability in devices such as Metal Insulator Semiconductor Field Effect Transistor (MISFET) devices known in the art. In MISFET-based transistor devices, the electrical potential of the gate influences the density of carriers (either electrons or holes) in the underlying channel region between the source and drain contacts of the MISFET, thereby modulating source-to-drain current flow. The insulator properties and thickness are chosen so as to prevent current flow of mobile carriers between the channel and the gate, yet enable the electrical potential of the gate to affect the electrical potential, and therefore the number of carriers in the source-to-drain channel, which, in turn, modulates the source-to-drain current flow.

In general, MISFET's can be divided into two sub-categories: 1) buried channel MISFET's in which majority carrier current flow takes place well below the insulator-semiconductor interface (approximately a Debeye Length (known in the art) into the semiconductor below the semiconductor-insulator interface), and 2) surface channel MISFET's where the vast majority of transistor current flow takes place just on the semiconductor side of the insulator-semiconductor interface. The very thin, high density layer of mobile carriers localized at the insulator-semiconductor interface in a surface-channel MISFET is often referred to as an "inversion layer" or "2 Dimensional Electron Gas layer." The most commonly employed sub-category of surface-channel MISFET devices is the inversion-channel MOSFET (Metal Oxide [$SiO_2$] Semiconductor Field Effect Transistor) which is the basic building block device for the vast majority of semiconductor integrated circuits on the market today. Another useful sub-category of surface-channel MISFET is known as the High Electron Mobility Transistor, or HEMT. Instead of using a true dielectric insulator such as $SiO_2$, the HEMT structure often employs a wider-bandgap semiconductor to serve as the "insulator" that resides between the gate and a narrower-bandgap semiconductor channel.

It is well-known to those skilled in the art that the electrical performance and reliability of surface channel MISFET's are greatly impacted by the quality of the insulator-semiconductor interface, especially its flatness dimension. In order to maximize transistor gain and current-carrying capability, it is desired that the effective mobility of carriers in the surface channel (i.e., inversion layer) be maximized. Spacial non-uniformities in the insulator-semiconductor interface (i.e., interface non-flatness) have repeatedly been shown to hinder the acceleration and flow of carriers in surface-channel MISFET inversion layers leading to reduced effective channel carrier mobilities which, in turn, cause decreased transistor gain and reduced current carrying capability. Furthermore, it is also well-known and well-documented that interface non-flatness (more commonly referred to as interface roughness) also impacts long-term reliability of MISFET's, particularly in MOSFET devices where high electric fields or high temperatures are encountered.

From a structural point of view, the ideal insulator-semiconductor interface in any MISFET structure is one that is atomically-flat along the interface, and is atomically abrupt across the interface in that the last monolayer of 100% semiconductor is immediately followed by the first monolayer of 100% insulator (i.e., no transitional monolayer of 50% insulator 50% semiconductor for example). The term "atomically-flat" is known in the art and is generally referred to herein as meaning a surface that is totally without any atomic-scale or macro-scale steps over an area defined by selected boundaries that may be created by grooves in a manner to be further described herein with reference to FIG. 4. Although, it is desired to provide an atomically-flat surface, the practice of the present invention can accommodate for the occurrence of up to about 10 steps over a defined area. The present invention, as will be described hereinafter, provides methodologies for obtaining large areas of atomically-flat surfaces, as well as atomically abrupt defect-free interfaces between two materials with different electrical properties, both of which could be employed in the fabrication of improved structurally ideal MISFET devices.

The formation of atomically-flat surfaces for a MISFET device in and of itself could in many cases be used to improve MISFET performance. More particularly, any insulator layer placed on top of the semiconductor as part of a MISFET process, regardless of deposition or thermal growth method, would likely have better (though not necessarily atomically-flat) interface roughness properties if starting from a relatively flat substrate prepared in accordance with the present invention, as to be described, rather than starting from a prior art substrate. In the case of inversion-channel MOSFET's superior smoothness is likely to be present after a thermal oxidation starting from an atomically-flat surface, prepared according to the present invention, which could improve effective inversion channel carrier mobilities, MOSFET gain and peak current, and improve MOSFET oxide reliability, especially under high-field and/or high-temperature operating conditions. While the above discussion has been directed primarily to surface-channel MISFET devices, the principles of this invention could be used to improve any structure that is impacted by the atomical flatness and/or atomical abruptness of a material junction, including homojunction semiconductor devices.

Semiconductor devices, including MISFET devices all related to the present invention, are used in a wide variety of electronic applications. Semiconductor devices include diodes, transistors, integrated circuits, sensors, and opto-electronic devices such as light-emitting diodes and diode lasers. Various semiconductor devices using silicon or compound semiconductors such as gallium arsenide (GaAs), gallium phosphide (GaP), and gallium nitride (GaN) of the group III and V elements are commonly used and are more fully described in the previously incorporated by reference book of Gerald B. Stringfellow. In order to fabricate semiconductor devices, it is necessary to be able to grow high-quality, low-defect-density single-crystal films with controlled impurity incorporation while possessing good surface morphology. The substrate upon which the film is grown should also be a high-quality, low-defect-density single crystal. In recent years, there has been an increasing interest in research on wide-bandgap semiconductors for use in high temperature, high power, high frequency, and/or high radiation operating conditions under which silicon and conventional III–V semiconductors cannot adequately function. Particular research emphasis has been placed on SiC, AlN, and GaN. It is believed by many experts that SiC will have advantages for high power applications because of its high breakdown electric field, high thermal conductivity, and GaN will have advantages for opto-electronic applications because of its wide direct bandgap. The recent development of commercial very bright blue GaN light emitting diodes (LED's) has spurred the world wide development efforts to produce blue and/or ultraviolet (UV) GaN laser diodes particularly suited for increased data capacity in digital optical storage media such as compact disc (CD) players.

As described in the previously incorporated by reference technical article of H. Morkoc et al, the recent surge of activity in wide-band-gap semiconductors has arisen from the need for electronic devices capable of operation at high power levels, high temperatures, and caustic environments, and separately, a need for optical materials, especially emitters, which are active in the blue and ultraviolet (UV) wavelengths. Electronics based on the existing semiconductor device technologies of Si and GaAs cannot tolerate greatly elevated temperatures of chemically hostile environments due to the uncontrolled generation of intrinsic carriers and their low resistance to caustic chemicals. The wide-band-gap semiconductors SiC and GaN, and perhaps sometime in the future, diamond, with their excellent thermal conductivities, large breakdown fields, and resistance to chemical attack, will be the materials of choice for these applications. In the optical device arena, the ever-increasing need for higher-density optical storage and full color display technologies are driving researchers to develop wide-band-gap semiconductor emitter technologies which are capable of shorter-wavelength operation.

Industries such as the aerospace, automotive, petroleum, and others have continuously provided the impetus pushing the development of fringe technologies which are tolerant of increasingly high temperatures and hostile environments. SiC and the III–V nitride devices will be capable of improved high-power and temperature operation due to their large band gaps. GaN may prove superior since it has lower ohmic contact resistances and is predicted to have larger electron saturation velocities.

In the field of optical devices, several trends are pushing research into new materials. The ever-increasing need for denser optical storage media is driving the development of shorter-wavelength semiconductor laser technologies because the diffraction-limited optical storage density increases quadratically as the probe laser wavelength is reduced. Towards this end, yellow lasers based on InGaAlP heterostructures have been successfully demonstrated; however, this material system is limited to 650 nm.

Wide-band-gap emitters are also bringing semiconductor technology to full color displays. For the first time, all three primary colors can be generated using semiconductor technology, which promises to allow the reliability, compactness, and other desirable attributes of semiconductors to be applied to this important technological market.

Silicon carbide and III–V nitride compounds have characteristics that make them highly advantageous for applications involving high temperature, high power, high frequency, and/or high radiation operating conditions. Such characteristics, for example, of silicon carbide, include a wide energy bandgap of 2.2 to 3.3 electron volts (depending on polytype), a high thermal conductivity, a high breakdown electric field, a high saturated electron drift velocity, and high dissociation temperature. Furthermore, silicon carbide, as well as III–V nitride compounds, is thermally, chemically and mechanically stable and has a great resistance to radiation damage. A variety of silicon carbide semiconductor devices have been fabricated and operated to temperatures exceeding 600° C.

Several properties of SiC make crystal growth difficult. First, SiC does not melt at reasonable pressures and it sublimes at temperatures above 1800° C. Second, SiC grows in many different crystal structures, called polytypes. Since melt-growth techniques cannot be applied to SiC, two techniques have been developed to grow SiC crystals. The first technique is known as chemical vapor deposition (CVD) in which reacting gases are introduced into a growth chamber to form SiC crystals on an appropriate heated substrate. A second technique for growing SiC crystals is generally referred to as the sublimation process (or modified sublimation process). In the sublimation technique, some type of solid SiC material other than the desired single crystal in a particular polytype is used as a starting material and heated until the solid SiC sublimes. The vaporized material is then condensed onto a seed crystal to produce the desired bulk single crystal. The sublimation process is still far from perfect because it produces many defects in the bulk crystal. A very serious defect is a tubular void (known as a micropipe), on the order of a micrometer in diameter, which propagates in the direction of growth. The density of micropipes in state-of-the-art commercial crystals is on the order of 100 cm$^{-2}$ and these are known to cause undesired premature electrical breakdown in pn junctions. Line dislocations also are produced in these bulk crystals at density of about $10^4$ cm$^{-2}$ and these dislocations are believed to contribute to undesirable leakage currents in reversed-biased pn junctions.

Semiconductor compounds formed from elemental semiconductors, compounds of Group III and Group V elements of the Periodic Table, such as GaAs and GaP, and compounds and alloys of the Group IV elements of the Periodic Table also have properties that need to be taken into account for successful growth and are more fully disclosed, for example, in the previously incorporated reference book of Gerald B. Stringfellow. The growth of these semiconductor compounds from elemental semiconductors, compounds of Group III and Group V elements of the Periodic Table and compounds and alloys of the Group IV elements of the Periodic Table is for both substrates and for films.

Silicon carbide crystals, as well as epitaxial group of the compounds formed from the elements of the Group III and Group V of the Periodic Table, exist in hexagonal, rhombohedral and cubic crystal structures. Generally, the cubic structure, with the zincblende structure, of the silicon carbide crystals is referred to as β-SiC or 3C-SiC, whereas numerous polytypes of the hexagonal and rhombohedral structures are collectively referred to as α-SiC. To our knowledge, only bulk (i.e., large) crystals of the α polytypes have been grown to date; the β (or 3C) polytype can only be obtained as small (less than 1 cm$^2$) blocky crystals or thick epitaxial films on small 3C substrates or crystal films grown heteroepitaxially on some other substrate. The most commonly available α-SiC polytypes are 4H-SiC and 6H-SiC; these are commercially available as polished wafers, presently up to 50 mm in diameter. Each of the SiC polytypes has its own specific advantages over the others. For example, (1) 4H-SiC has a significantly higher electron mobility compared to 6H-SiC; (2) 6H-SiC is used as a substrate for the commercial fabrication of GaN blue light-emitting diodes (LED's); and (3) 3C-SiC has a high electron mobility similar to that of 4H and may function at lower temperatures, compared to the a polytypes.

Silicon carbide polytypes are formed by the stacking of double layers of Si and C atoms. Each double layer may be situated in one of three positions, known as A, B, and C. The sequence of stacking determines the particular polytype; for example, the repeat sequence for 3C is ABCABC . . . (or ACBACB . . . ), the repeat sequence for 4H is ABACABAC . . . , and the repeat sequence for 6H is ABCACBABCACB . . . . From this it can be seen that the number in the polytype designation gives the number of double layers in the repeat sequence and the letter denotes the structure type (cubic, hexagonal, or rhombohedral). The stacking direction is designated as the crystal c-axis and is in the crystal [0001] direction; it is perpendicular to the basal plane which is the crystal (0001) plane. The {111} planes of the cubic structure are equivalent to the (0001) plane of the a polytypes. The SiC polytypes are polar in the <0001> directions: in one direction, the crystal face is terminated with silicon (Si) atoms; in the other direction, the crystal face is terminated with carbon (C) atoms. These two faces of the (0001) plane are known as the Si-face and C-face, respectively. As used herein, "basal plane" shall refer to either the (0001) plane for a α-SiC, or the (111) plane of 3C-SiC. The term "vicinal (0001) wafer" shall be used herein for wafers whose polished surface (the growth surface) is misoriented less than 80 from the basal plane. The angle of misorientation shall be referred to herein as the tilt angle. The term "homoepitaxial" shall be referred to herein as epitaxial growth, whereby the film and the substrate (wafer) are of the same polytype and material, and the term "heteroepitaxial" shall be referred to herein as epitaxial growth whereby the film is of a different polytype or material than the substrate. The GaN based Group III and Group V nitrides semiconductors have bonded polytypes similar to those of SiC and are more fully described in Section III of the previously incorporated by reference technical article of H. Morkoc et al.

As of now, to our knowledge, there is no existing method for producing large (greater than 1-inch diameter) high-quality single-crystal 3C-SiC boules. Hence, no acceptable-quality 3C-SiC wafers are available. In a prior art process, single-crystal homoepitaxial 6H-SiC films can be grown on vicinal 6H-SiC substrates with tilt angles in the range 0.1° to 6° in the temperature range 1400° C. to 1600° C. by chemical vapor deposition (CVD) if the surface is properly prepared in a manner more fully described in U.S. Pat. No. 5,248,385 which is herein incorporated by reference. In addition to homoepitaxial 6H-SiC on 6H-SiC, 3C-SiC can be heteroepitaxially grown on 6H-SiC (or other α-Sic) substrates with tilt angles less than 1°. However, this generally results in 3C-SiC films which have defects known as double positioning boundaries (DPB's). The DPB's can arise because of the change in stacking sequence of the 6H-SiC wafer (i.e., ABCACB . . . ) to that of 3C-SiC (ABC . . . or ACB . . . ) at the interface between the two polytypes. The difference between the two 3C sequences is a 60° rotation about the <111> axis. If both of these two sequences nucleate on the 6H-SiC substrate, DPB's will form at the boundary of the domains containing the two sequences.

Theories explaining epitaxial single-crystal growth are well known. Crystal growth can take place by several mechanisms. Two of these are: (1) growth can take place by the lateral growth of existing atomic-scale steps on the surface of a substrate, and (2) growth can take place by the formation of two-dimensional atomic-scale nuclei on the surface followed by lateral growth from the steps formed by the nuclei. The lateral growth from steps is sometimes referred to as "step-flow growth." In the first mechanism, growth proceeds by step flow from existing steps without the formation of any two-dimensional nuclei (i.e., without 2D nucleation). In the nucleation mechanism, the nucleus must reach a critical size in order to be stable; in other words, a potential energy barrier must be overcome in order for a stable nucleus to be formed. Contamination or defects on the substrate surface can lower the required potential energy barrier at a nucleation site. In the processes described in this invention, crystal growth proceeds by (1) step flow without 2D nucleation, or by (2) step flow with 2D nucleation. Step flow growth with 2D nucleation allows the growth of epitaxial films of any desired thickness. A prior art process for growing 3C-SiC on 6H-SiC with reduced density of DPB's is presented in U.S. Pat. No. 5,363,800 ('800) which is herein incorporated by reference. In this improved process, the surface of a 6H-SiC substrate with a tilt angle of less than 1° is divided up into an array of selected regions (herein called mesas) that are separated from one another by grooves. Each mesa acts as an independent substrate. In the process of the '800 patent, nucleation of 3C-SiC is caused to occur at the topmost atomic plane of each mesa, preferably at one corner of the mesa, and then 3C-SiC grows laterally from this point and eventually covers the whole mesa. It is assumed in this process of the '800 patent that the vicinity of the topmost plane of each mesa is atomically flat and is thus a preferred site for 3C-SiC nucleation. This prior art process of the '800 patent appears to have several disadvantages. First, it does not give any reproducible method for causing 3C-SiC to nucleate at the desired location on each mesa.

Second, the 3C-SiC nucleation takes place when there are still atomic-scale steps on the mesa; these steps can act as nucleation sites for 3C-SiC if there are defects or contamination present on the surface. And finally, although the density of DPB's and associated stacking faults are greatly reduced, stacking fault density due to other causes appear to be still very high.

Using other prior art growth techniques, we have observed the nucleation of a large density of two-dimensional islands on 6H-SiC substrates in crystal growth experiments using chemical vapor deposition (CVD). In growth experiments by Kimoto and Matsunami on "well-oriented" (i.e., very small tilt angles with respect to the basal plane) SiC substrates over the temperature range 1200° C. to 1600° C., nucleation densities in the range $4 \times 10^3$ to $1 \times 10^6$ cm$^{-2}$ were observed. In these same experiments, Kimoto and Matsunami observed 3C-SiC nuclei with two different rotational orientations growing on the "well-oriented" 6H-SiC substrates. The experiments of Kimoto and Matsunami are disclosed in the technical article "Nucleation and Step Motion in Chemical Vapor Deposition of SiC on 6H-SiC {0001} Faces," by T. Kimoto and H. Matsunami, published in *J. Applied Physics,* Vol. 76, No. 11, pp. 7322–7327 (1994), and which is herein incorporated by reference.

As discussed above, 3C-SiC, to our knowledge, is not available in high-quality single-crystal wafer form; hence, the epitaxial 3C-SiC device structures must be grown heteroepitaxially on some other material. The present invention overcomes the problems of prior art in the growth of high-quality low-defect 3C-SiC films on 6H-SiC substrates.

In addition to non-availability of high-quality 3C-SiC single-crystal wafers, other wide-bandgap semiconductor compounds that are not available in single-crystal wafer form and which, because of the practice of the present invention, have great commercial potential are the nitrides of aluminum and gallium. Gallium nitride (GaN), in particular, has great potential as an optoelectronic material. Currently, commercial light-emitting diodes are being fabricated by growing GaN films on 6H-SiC or sapphire substrates. Even though these films have extremely high defect density (typically around $10^{10}$ cm$^{-2}$), very bright and efficient LED's can be fabricated. Pulsed blue lasers have been fabricated from GaN; continuous blue lasers that operate for more than ten (10) thousand hours before failure have been fabricated. The present invention provides a means for reducing defects in, for example, the GaN films and hence improve performance of GaN lasers possible.

In prior art growth experiments reported by Davis et al in a technical article entitled "Initial Stages of Growth of SiC and AlN Thin Films on Vicinal and On-axis Surfaces of 6H-SiC (0001)," published in *Inst. Phys. Conf. Ser.* No. 142, Chapter 1, page 133 (which is herein incorporated by reference), low-defect films of 3C-SiC and 2H-AlN were grown on terraces on "on-axis" (i.e., low tilt angle) 6H-SiC substrates. The films were grown by gas-source molecular beam epitaxy (GSMBE) and had thicknesses of less than 2 nm. In other prior art experiments by the same research group and reported by Tanaka et al in a technical article entitled "Control of the Polytypes (3C, 2H) of Silicon Carbide Thin Films Deposited on Pseudomorphic Aluminum Nitride (0001) Surfaces," published in *Inst. Phys. Conf. Ser.* No. 142; Chapter 1, page 109 (herein incorporated by reference), 3C-SiC and 2H-SiC were grown by GSMBE on the thin films of 2H-AlN on "on-axis" 6H-SiC substrates. The C/Si ratio of the input gases determined the polytype of the SiC film: C/Si=1 yielded 3C-SiC and C/Si=5 yielded 2H-SiC. Very few defects were observed in films grown on the on-axis substrates compared to films grown on off-axis (i.e., 3° tilt angle) substrates. A possible drawback with these experiments is that the results were obtained on atomic-scale terraces on the on-axis substrates. We do not have any knowledge of any method of making these atomic-scale results applicable to larger useful device-sized regions of the substrates. Also, there is no discussion by Davis et al of the impact of defects in the SiC substrates on the quality of the crystal films.

In another prior art process reported by Morlock et al., entitled "Extremely Flat Layer Surfaces in Liquid Phase Epitaxy of GaAs and Al$_x$Ga$_{1-x}$As" by U. Morlock, M. Kelsch, and E. Bauser, published in *J. Crystal Growth,* Vol. 87, pp.343–349 (1988), which is herein incorporated by reference, extremely flat surfaces were produced on mesas up to 1 mm$^2$ in size on GaAs and AlGaAs substrates by a liquid phase epitaxy (LPE) process. These flat surfaces appeared as facets on the top of the mesas. Although the surfaces were extremely flat, from our understanding the surfaces actually consisted of very shallow hillocks where the center of each hillock was a dislocation that acted as a continuous source of steps. Accordingly, each mesa was covered with monomolecular steps emanating from the numerous localized step sources. The terrace width (distance between steps) varied from 0.5 to 50 μm.

A disadvantage of prior art processes for the growth of SiC epilayers on SiC substrates (e.g., homoepitaxial growth of 6H-SiC on 6H-SiC) is that the step-flow growth employed in growth on "offaxis" commercial wafer can result in epilayers with large surface steps (tens of nanometers high) formed by the "step bunching" of smaller atomic-scale steps (approximately 1 nanometer high). These steps may very well hinder the development and operation of small scale devices which are of concern to the present invention.

The disadvantage of the prior art processes are overcome by the present invention providing an atomically flat substrate and upon which is formed, for example, from a semiconductor nitride growth so as to yield devices having high optoelectronic performance, high temperature capabilities and/or high frequency attributes.

SUMMARY OF THE INVENTION

The practice of the present invention particularly related to atomically-flat crystalline surfaces and crystal films is partially based on our discovery of three factors: (1) two-dimensional crystal nucleation can be reduced to zero, or near zero, on the SiC basal plane for selected growth conditions; (2) atomically-flat, or nearly atomically-flat, device-sized surfaces can be grown on the SiC basal plane under these selected growth conditions; and (3) two-dimensional crystal nuclei grown on an atomically-flat basal plane under other selected growth conditions take on only one of two possible rotational orientations. The growth of crystal nuclei with a single rotational orientation on an atomically flat basal plane is one of the bases of our invention for providing a method of growing low-defect crystal film structures such as, films formed from AlN and GaN. Also, based on the reported dependence of the growth rate of Si and GaAs on crystal orientation, this invention is applicable to the homoepitaxial growth of atomically-flat surfaces on elemental semiconductors, compounds of Group III and Group V elements of the Periodic Table and compounds and alloys of the Group IV elements of the Periodic Table serving as substrates.

In general, the invention provides a method of producing single-crystal atomically-flat surfaces on a single-crystal substrate comprising the step of choosing a single-crystal substrate material which exhibits a property that the material contains at least one growth plane orientation, whereby under selected growth conditions the growth rate due to step-flow growth is at least one hundred (100) times greater than the growth rate due to growth involving two-dimensional nucleation. The method further comprises the steps of preparing, removing, treating, depositing and, then, continuing the depositing. The method prepares a planar growth surface on the substrates that is parallel to within a predetermined angle relative to the at least one growth plane orientation of the substrate. The method then removes material in the substrate so as to define at least one selected separated area having boundaries. The method then treats the substrate so as to remove any sources of unwanted crystal nucleation and to remove any unwanted sources of steps. The method then deposits a homoepitaxial film over the at least one selected separated area under selected conditions so as to provide a step-flow growth while suppressing two-dimensional nucleation. The method continues the depositing of the homoepitaxial film until the step-flow growth obtains an atomically-flat epitaxial film surface on each of the at least one separated area where the atomically-flat surface is parallel to the selected crystal plane.

In one embodiment, the invention provides a method of producing atomically-flat single-crystal surfaces and low-defect crystal film structures of compounds and the element Si. This method is accomplished by utilizing particular homoepitaxial/heteroepitaxial growth processes on a substrate of different material and/or structure than the desired crystal film. The method is comprised of the following steps: first, an array of mesas of desired size is produced on a suitable single-crystal substrate (e.g., Si or 6H-SiC); second, atomically-flat surfaces are produced on the top of each mesa by growing a homoepitaxial film under conditions that allow step-flow growth without significant two-dimensional crystal nucleation on the terraces between steps on the surface; and third, growth conditions are altered such that heteroepitaxial growth is carried out by way of intentional two-dimensional nucleation of the desired film (e.g., 3C-SiC), plus step-flow growth from the two-dimensional nuclei, on the atomically-flat surfaces without interference from defects and steps that existed on the original substrate surface. In the case of Si, the third step would consist of additional homoepitaxial growth. Additional growth procedures can produce multi-layer doped structures of compounds such as SiC, AlGaN, AlN, GaN, and other semiconductors of the compounds formed from elements of Group III and Group V of the Periodic Table and compounds and alloys of the Group IV elements of the Periodic Table.

Further, the present invention relates to a method of growing high-quality low-defect crystal films of polytypic compounds heteroepitaxially on polytypic compound substrates that are different than the film. As examples, the growth of 3C-SiC, 2H-AlN, and 2H-GaN on 6H-SiC will be described.

In accordance with the principal feature of the invention, there is provided a method for preparing a substrate surface and subsequently growing a low-defect crystal film of Si and/or semiconductors of the compounds formed from the elemental semiconductors, compounds of Group III and Group V elements of the Periodic Table and compounds and alloys of the Group IV elements of the Periodic Table in an epitaxial growth process on the specially prepared substrate. The substrate is of a material selected from the group comprising elemental semiconductors, compounds of Group III and Group V elements of the Periodic Table and compounds and alloys of the Group IV elements of the Periodic Table. In summary, the inventive method, in one embodiment, is comprised of several steps. First, a substrate is prepared with a planar surface whose orientation is within 1° of a selected crystal plane (i.e., (111) plane for Si, (0001) plane for SiC). Second, separate growth regions (herein called mesas) are established on the planar surface that are separated from one another by continuous depressions (herein called grooves) in the planar surface. Third, a step-flow homoepitaxial growth of Si or SiC is carried out by the lateral growth of atomic-scale steps that are present on the surface. These steps are caused by the small tilt angle of the polished mesa top relative to the basal plane. The homoepitaxial growth conditions are selected to minimize two-dimensional nucleation on the terraces between steps. It is important in the selection of the substrate and in the preparation of the mesa tops to produce growth surfaces that are free, or nearly free, of contamination, localized sources of step sources (e.g., screw dislocations) and/or other defects (e.g., edge dislocations) since these defects can cause two-dimensional nucleation or can be a continuous source of undesired growth steps. The step-flow homoepitaxial growth is continued until an atomically-flat, or nearly atomically-flat surface is produced across the entirety on each mesa top. Fourth, growth conditions are changed to promote two-dimensional nucleation of a desired homoepitaxial or heteroepitaxial crystal film on the atomically-flat, or nearly atomically-flat mesas. For example, Si could be grown on Si, or AlN, GaN or AlGaN could be grown directly on an atomically flat 6H-SiC mesa. Conditions can be established that promote two-dimensional nucleation over the whole mesa or at selected locations on the mesa. Step-flow growth takes place from the two-dimensional nuclei. This growth is continued by two-dimensional nucleation until the desired film thickness is obtained. This growth by two-dimensional nucleation can be repeated with a SiC polytype or III–V compound to produce a layered structure with two or more crystal films. If additional layers are desired, then it is preferred that conditions at the end of the growth of a given polytypic layer be altered to minimize two-dimensional nucleation so that the entire surface is atomically-flat, or nearly atomically-flat, for the subsequent growth of the next layer of a different crystal film.

A specific application of this invention is the growth of 3C-SiC on a 6H-SiC substrate. Another application is the growth of 2H-GaN on a 6H-SiC substrate. A further application is to more broadly provide a substrate of a material selected from the group comprising elemental semiconductors, compounds of Group III and Group V elements of the Periodic Table and compounds and alloys of the Group IV elements of the Periodic Table. An example of a two-layer crystal film is 2H-GaN on top of 2H-AlN on top of a 6H-SiC substrate. In this case, an AlN acts as a buffer layer between the GaN and SiC for better lattice matching. Other SiC polytypes, such as 4H-SiC could also be used as substrates in the practice of this invention.

The present invention is based on our discovery that two-dimensional nucleation on SiC substrates can be reduced to zero, or near zero, for a wide range of growth conditions if the Sic substrate is properly prepared. Also, as reported in the log literature, the growth rate (or nucleation rate) can be controlled on selected crystal planes (e.g., (111) plane of Si or GaAs). Based on prior art processes, two-dimensional nucleation occurs on atomic-scale terraces (on the order of a micrometer wide) on Sic substrates, whereas with Si, Sic, and elements of Groups III, IV and V making up the substrates prepared according to the teachings of the present invention, two-dimensional nucleation has been reduced to zero, or nearly zero, over regions of the order of a millimeter wide. When growth by two-dimensional nucleation is carried out on atomically-flat surfaces by the practice of the present invention, then under proper growth conditions such as those for nitride growth, all crystal islands that nucleate will have the same rotational orientation; hence, the formation of defects will be eliminated, or dramatically reduced. Thus, the present invention can be applied to the growth of usefully large device-sized regions of low-defect films of 3C-SiC, 2H-AlN, and 2H-GaN on 6H-SiC substrates.

In the practice of our invention, important considerations to achieve growth with no two-dimensional nucleation are the following: contamination and surface defects must be minimized because they reduce the energy barrier that hinders two-dimensional nucleation. Also, line defects (dislocations) that intersect the growth surface must be minimized because some dislocations act as localized step sources that can dominate growth on the mesas preventing the achievement of an atomically-flat, or nearly atomically-flat, mesa. A further teaching of the invention is that multiple rotational orientations of the polytypic stacking sequence can occur on surfaces with steps when a 2H or a 3C sequence is grown on a higher order polytypic substrate, such as a 4H or a 6H polytypic sequence. When crystal film islands, that have different rotational orientations, coalesce, then defects such as double positioning boundaries (DPB's) form at a boundary between the two domains are reduced. Furthermore, an advantage of the atomically flat growth surfaces provided by the practice of the present invention is that nitride island formed during nitride growth will have the same orientation, rather than random orientations that occur in growth on substrates with atomic-scale steps. Another teaching of the present invention is that only a single orientation of the 3C polytype will form on an atomically-flat 6H sequence under suitable growth conditions. It is expected that this same behavior will hold for the 2H sequence grown on the 4H or 6H sequence.

BRIEF DESCRIPTION OF THE DRAWINGS

FIG. 5 is a cross-sectional schematic drawing that illustrates atomic-scale growth steps that are produced when the polished growth surface is tilted off-axis by an angle $\Theta$ relative to the basal plane.

FIG. 6 is a schematic diagram illustrating an atomically-flat surface of the present invention achieved after homoepitaxial step-flow growth without two-dimensions (2D) nucleation of a 6H-SiC film on a 6H-SiC substrate (under growth conditions that suppress 2D nucleation).

DETAILED DESCRIPTION OF THE PREFERRED EMBODIMENT

Figure 1:
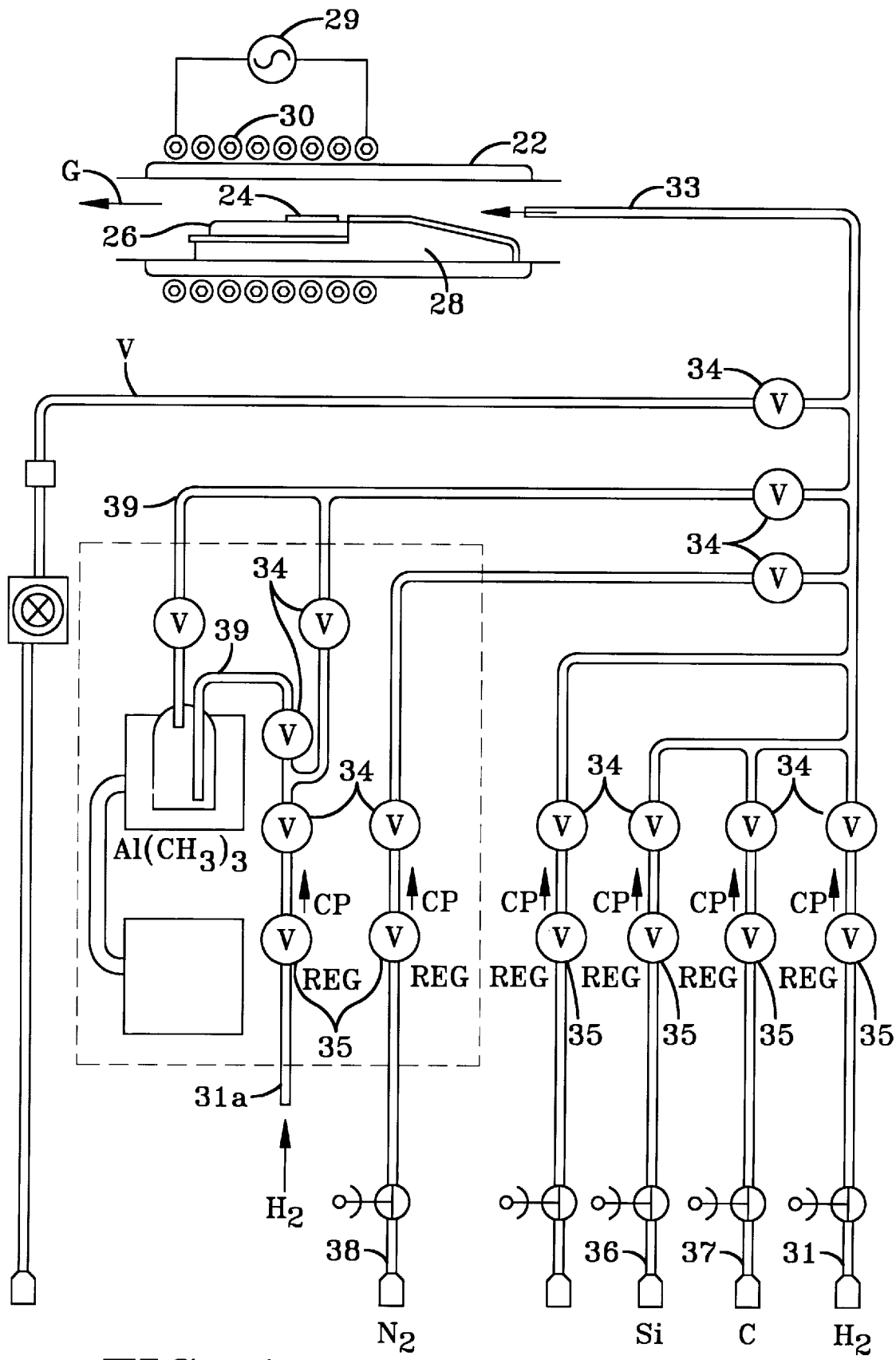
FIG. 1 is a schematic drawing of a CVD system employed for the growing crystal films in accordance with the present invention.

Referring now to the drawings, wherein the showings are for the purpose of illustrating preferred embodiments of the invention only and not for the purpose of limiting the same, the invention describes an improved chemical vapor deposition (CVD) method for obtaining improved quality of the grown crystal films. A prior art chemical vapor deposition (CVD) process is disclosed in U.S. Pat. No. 5,463,978 which is herein incorporated by reference. While the method of the present invention may be applied to many different crystals and is contemplated by the present invention, the method will primarily be specifically described with respect to the growing of silicon carbide (Sic) crystals with a homoepitaxial film being deposited on the single-crystal substrate, and, furthermore, with at least one heteroepitaxial film deposited on the homoepitaxial film. The multiple heteroepitaxial films are selected from the group comprising GaN, AlN, AlGaN, GaAs, AlGaAs, GaSb, AlGaInP, and InGaAs. The method of the invention can be applied to crystal substrates of a material selected from the group comprising elemental semiconductors, compounds of Group III and Group V elements of the Periodic Table and compounds and alloys of the Group IV elements of the Periodic Table.

In general, the invention provides a method of producing single-crystal atomically-flat surfaces on a single-crystal substrate comprising the step of choosing a single-crystal substrate material which exhibits the property that the material contains at least one growth plane orientation, whereby under selected growth conditions the growth rate due to step-flow growth is greater than at least one hundred (100) times greater than the growth rate due to growth involving two-dimensional nucleation. The method further comprises the steps of preparing, removing, treating, depositing and, then continuing the depositing. The method prepares a planar growth surface on the substrate that is parallel to within a predetermined angle relative to the at least one growth plane orientation of the substrate. The method then removes material in the substrate so as to define at least one selected separated area having boundaries. The method then treats the substrate so as to remove any sources of unwanted crystal nucleation and to remove any unwanted sources of steps. The method then deposits a homoepitaxial film over the at least one selected separated area under selected conditions so as to provide a step-flow growth, while suppressing two-dimensional nucleation. The method continues the depositing of the homoepitaxial film until the step-flow growth obtains an atomically-flat epitaxial film surface on each of the at least one separated area where the atomically-flat surface is parallel to the selected crystal plane.

In one embodiment, a CVD method is provided which includes pretreating a substrate, heating the substrate in a reaction chamber, introducing a carrier gas, vaporizing the crystal growing compounds, introducing the vaporized compounds in the reaction chamber via the carrier gas, and maintaining proper energy levels and material flow rates in the reaction chamber for a sufficient time to grow a crystal film having a desired smooth surface morphology, a uniform thickness, a low-defect density and a controlled impurity profile. The crystals may be intentionally doped to form n-type and/or p-type crystals. The improved CVD crystal growing method is based on our discovery that atomically-flat basal-plane surfaces can be grown by step-flow growth (without two-dimensional (2D) nucleation) over a wide range of conditions provided the substrate surface is properly prepared, and that two-dimensional nucleation growth on an atomically-flat basal-plane surface can produce 3C-SiC islands with a single rotational orientation.

The proper preparation of the substrate surface includes preparing a growth surface which is approximately parallel to a selected crystal orientation. In the case of SiC, the selected orientation is the (0001) basal plane. In the case of cubic materials (e.g., Si, GaAs and other III–V compounds), one preferred orientation is the (111) plane. Other crystal planes in these and other materials may also be suitable as the growth planes. The material which is chosen should exhibit the property that the material contains at least one growth plane orientation, whereby under selected growth conditions the growth rate due to step-flow growth is at least one hundred (100) times greater than the growth rate due to growth involving two-dimensional nucleation. These materials include, but are not limited to, Si, GaAs, and other elemental semiconductors, compounds of Group III and Group V elements of the Periodic Table and compounds and alloys of the Group IV elements of the Periodic Table. Many of these materials have a cubic crystal structure. As is to be further described, the nucleation rate for these cubic materials can be affected by the temperature and/or orientation of the crystal growth plane. As will be further described, the growth rate for these materials (and by implication, the nucleation rate) can be reduced to zero, or near zero, in certain growth directions. Also, the polarity of the (111) growth plane (e.g., the (111)As or (111)Ga) can affect the growth rate. Based on the decreased growth rate on growth planes nearly parallel to the (111) plane, a preferred growth plane is the (111) plane for the implementation of this invention with these materials.

The method of the invention can be carried out with a conventional chemical vapor deposition (CVD) system similar to that used in Si, SiC and GaAs semiconductor technology. Furthermore, once the substrate is prepared in accordance with the principles of the present invention, the epitaxial growth of nitrides of Group III and Group V of the Periodic Table may be accomplished by conventional means, such as disclosed in the previously incorporated by reference book of Gerald B. Stringfellow. In addition, the substrate of the present invention formed from the compounds, such as GaAs and GaP, from the group comprising elemental semiconductors, compounds of Group III and Group V elements of the Periodic Table and compounds and alloys of the Group IV elements of the Periodic Table may be provided by conventional means following the teaching of Gerald B. Stringfellow. The gases used in a SiC CVD system are hydrogen (used as a carrier gas), silane (used as a source of Si), propane (used as a source of C), HCl (used for cleaning and etching the substrate surface), nitrogen ($N_2$) (used as a n-type dopant), and trimethyl aluminum (TMA) (used as a p-type dopant). Other gases may be used as the Si or C source or used to dope the crystal. If organic compounds are used as the Si and C sources, the process is commonly referred to as metal-organic vapor phase epitaxy (MOVPE). Further, organometallic vapor phase epitaxy (OMVPE) is primarily used to grow III–V compounds as described in the reference book of Gerald B. Stringfellow. Any CVD system that can deliver these gases to a suitable reaction chamber at the proper flow rates under high purity conditions and at the proper substrate temperatures can be used for the method of the present invention.

Referring now to FIG. 1, there is shown a schematic, partial view of one suitable CVD reaction system for carrying out one part of the process of the invention. The CVD reaction system includes a reaction chamber 22 comprised of a double-walled quartz tube such that the inner quartz tube can be water-cooled. A substrate 24, preferably formed of SiC, is supported by a SiC coated graphite susceptor 26, which, in turn, is supported by quartz support 28. To produce the desired temperature of the surface of substrate 24, a radio-frequency (RF) induction coil 30 is disposed around reaction chamber 22. Induction coil 30 is powered by frequency generator 29. The RF field produced by induction coil 30 heats substrate 24 via susceptor 26 to the desired temperature of the susceptor 26. When SiC film layers are grown, substrate 24 is preferably a SiC substrate. The gaseous crystal compounds are introduced into reaction chamber 22 by primary line 33. Primary line 33 is located at one end of reaction chamber 22 and directs the gases to flow in direction G across substrate 24 and out the opposite end of chamber 22. The various gaseous crystal compounds are connected to primary line 33 and the gas flow is regulated by valves 34 and regulators 35 connected to each gas line. Line 36 is the silicon gas line that controls the silane flow into primary line 33, and line 37 is the carbon gas line that controls the propane flow into primary line 33. The dopants are introduced into primary line 33 by line 38 and line 39. Line 38 is the n-type dopant line and preferably controls the nitrogen gas ($N_2$) flow rate. Line 39 is the p-type dopant line and preferably controls the trimethyl aluminum (TMA) flow rate. Carrier gas line 31 carries all the gaseous crystal compounds and dopants through primary line 33 and into reaction chamber 22. The carrier gas is preferably a gas such a hydrogen gas ($H_2$). Carrier gas line 31 is partially diverted into line 31a to supply line 39 so that the carrier gas can be bubbled through the liquid TMA. A vacuum line (V) connected to a vacuum can be connected to primary line 33 to evacuate reaction chamber 22 of gases.

Figure 2:
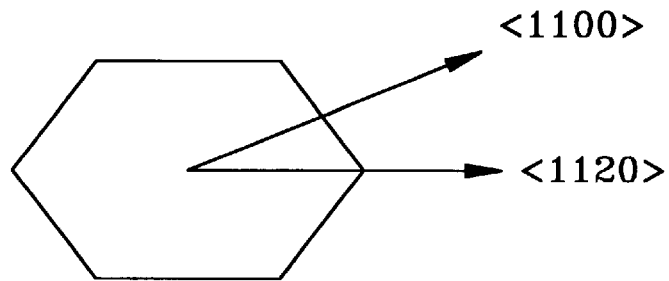
FIG. 2 illustrates a plan view of a 6H-SiC crystal showing the crystallographic axes of the crystal.
Figure 3:
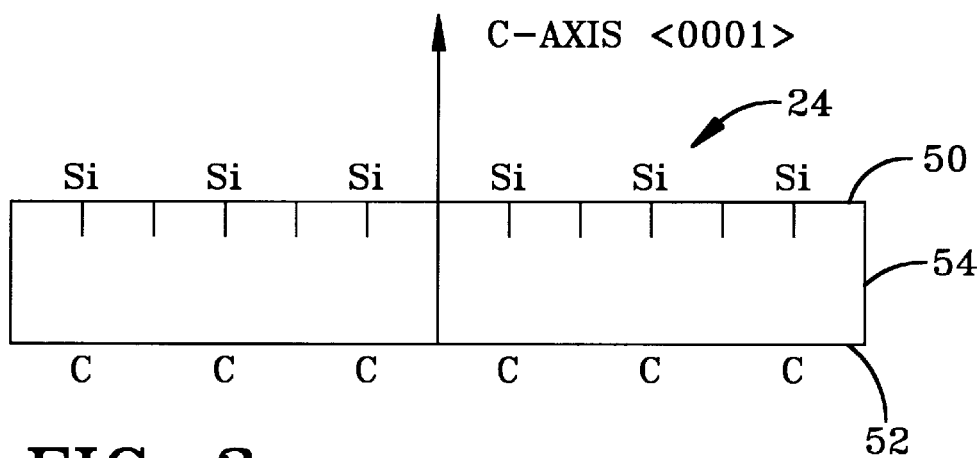
FIG. 3 is a cross-sectional view of a SiC substrate showing the Si-face, the C-face and the A-face of the substrate.

SiC substrate 24 is prepared by slicing a section from a SiC boule. Substrate 24 is cut such that the surface is slightly misoriented relative to the basal plane by tilt angle of less than 1°. The tilt direction is preferably toward the <1120> direction, as illustrated in FIG. 2, to produce the optimum growth rates and quality of the SiC epitaxial films grown on substrate 24. The surface of substrate 24 is polished preferably on one surface with a diamond paste and a final polish using a chemical-mechanical polishing technique. SiC substrate 24 has three faces, a Si-face 50, a C-face 52 and the A-face 54, as illustrated in FIG. 3. Preferably, Si-face 50 is polished and used for epitaxial growth. It has been found that Si-face 50 produces the highest-quality epitaxial layer films which have the best surface morphology and lowest defects.

Figure 4:
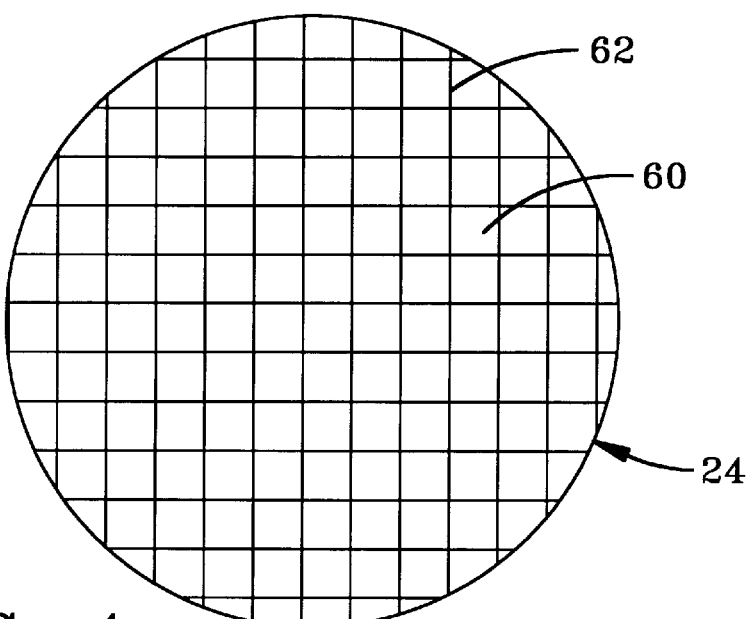
FIG. 4 is a plan view of a substrate that has been divided into isolated growth regions (mesas).

Substrate 24 is further prepared by creating boundaries or grooves 62 on the face of substrate 24 which form growth regions 60 (also called mesas), as illustrated in FIG. 4. Grooves 62 forming growth region boundaries 62 are preferably cut by physical means such as a precision dicing saw with a 25 micrometer thin blade to minimize crystal damage; however, boundaries 62 may be formed by other physical means such as photolithography, laser etching, ion etching and/or photochemical or electrochemical etching processes. The width of groove 62 need only be less than 10 micrometers, but larger widths can also be used. The depth of groove 62 is preferably about 50 micrometers, but may be deeper or shallower. Typically, an array of device-size regions, 1 millimeter×1 millimeter in size, is produced on the substrate 24. Other sizes, larger or smaller, can be produced.

Once the substrate surface has been polished and growth regions 60 have been formed, substrate 24 is pretreated to remove contaminants or impurities on the surface of the substrate so as to facilitate the growing of high-quality, low-defect epitaxial films. Various pregrowth treatments, such as oxidation, chemical mechanical polishing, or reactive ion etching, may be used to remove potential unwanted nucleation sites prior to growing the crystal epilayers. Then, substrate 24 is placed in reaction chamber 22. Prior to growing the crystal film layers on substrate 24, the substrate is pretreated with a pregrowth process to remove contaminants and defects on the surface of the substrate 24 that could act as unwanted sites for two-dimensional nucleation of the SiC film layers. These defects on the surface of the substrate can be generated during the cutting and polishing of the substrate. Preferably, the pregrowth process involves subjecting substrate 24 to a high temperature gaseous etch in a mixture of hydrogen chloride gas and hydrogen within the reaction chamber 22. The pregrowth process is such that the substrate is not altered in a way that unwanted sites for two-dimensional nucleation are produced on the surface of the substrate. Preferably, the etch uniformly removes material from the surface of substrate 24 to ensure a low-defect, highly-pure surface. A typical etch is carried out for about 20 minutes at a temperature of 1350° C. using about 3–4% hydrogen chloride gas in an $H_2$ carrier gas with a flow of about 3 liters per minute. Preferably, the concentration of the hydrogen chloride gas ranges between 1–5% during the pregrowth etch. Lower hydrogen chloride gas concentrations may not properly remove all the contaminants and surface defects from the substrate. Higher hydrogen chloride gas concentrations may produce a rough surface morphology or pits on the substrate, which may cause undesired nucleation sites throughout the surface of the substrate. The temperature during the etch ranges between 1200–1500° C. Lower temperatures would probably not properly eliminate two-dimensional nucleation sites. Temperatures greater than 1500° C. could too rapidly etch the substrate surface around the peripheral edge of the substrate and introduce unwanted two-dimensional nucleation sites upon the surface of the substrate.

Once substrate 24 has been pretreated, reaction chamber 22 is prepared for crystal growth. Reaction chamber 22 is preferably evacuated by vacuum via vacuum line V and subsequently purged with an inert gas to remove impurities. Hydrogen gas may be used to purge the reaction chamber. Once the reaction chamber is purged, the carrier gas flow rates and the temperature within the reaction chamber are brought to equilibrium. Hydrogen gas is preferably used as the carrier gas, but other gases (e.g., inert gases) can be used. Once the temperature and flow within the reaction chamber 22 have reached equilibrium, generally within less than one minute, silane and propane are added to the carrier gas to initiate SiC growth. Preferably, the silane concentration within the carrier gas is approximately 200 ppm resulting in a 200 ppm atomic concentration of Si. Preferably, the amount of propane introduced into the carrier gas is approximately 130 ppm to 600 ppm resulting in an atomic concentration of C between 390 ppm to 1800 ppm. The prescribed pretreatment of substrate 24 allows for significantly greater deviations from the optimum Si/C ratio than was previously thought possible for growing high-quality, low-defect SiC crystals. The ratio of the atomic concentrations of Si to C may be varied to create different growth rates and different growth conditions for SiC epilayers. The ratio may range between 0.1 and 0.8.

The first phase of crystal growth can be described by referring now to FIG. 5 where there is shown an atomic-scale cross-sectional drawing of 6H-SiC substrate 24 prior to the start of growth. FIG. 5 illustrates atomic-scale steps 41 that are present on the growth surface because of the tilt angle, Θ, of the actual growth surface 42 (shown in phantom) relative to the crystal basal plane 43. In the first phase of the growth process (to produce an atomically-flat surface), growth conditions are set to promote step-flow growth, and to minimize growth by two-dimensional nucleation. These conditions consist of higher growth temperatures (1400 to 2200° C.) and lower concentrations of silane and propane. Growth of the first phase is continued until an atomically-flat, or nearly atomically-flat, epitaxial surface is obtained.

With reference to FIG. 6, there is shown an atomic-scale cross-sectional drawing of a 6H-SiC substrate after homoepitaxial step-flow growth (without 2D nucleation) has produced an epitaxial film 44 with an atomically-flat surface 45. Typically, SiC epilayer growth rates from a carrier gas containing 200 ppm silane and 600 ppm propane produce a vertical epilayer film growth rate parallel to the c-axis of about 3 micrometers per hour. At this vertical rate of growth, the lateral growth of steps is much higher and is inversely proportional to the tilt angle Θ. The lateral growth rate for a 0.2° tilt angle and a 3 micrometer per hour vertical growth rate is 0.9 millimeters per hour; hence, at this rate, an atomically-flat epilayer can be grown over a 1 millimeter×1 millimeter square region in 70 minutes. This time can be reduced by using smaller tilt angles.

Figure 7:
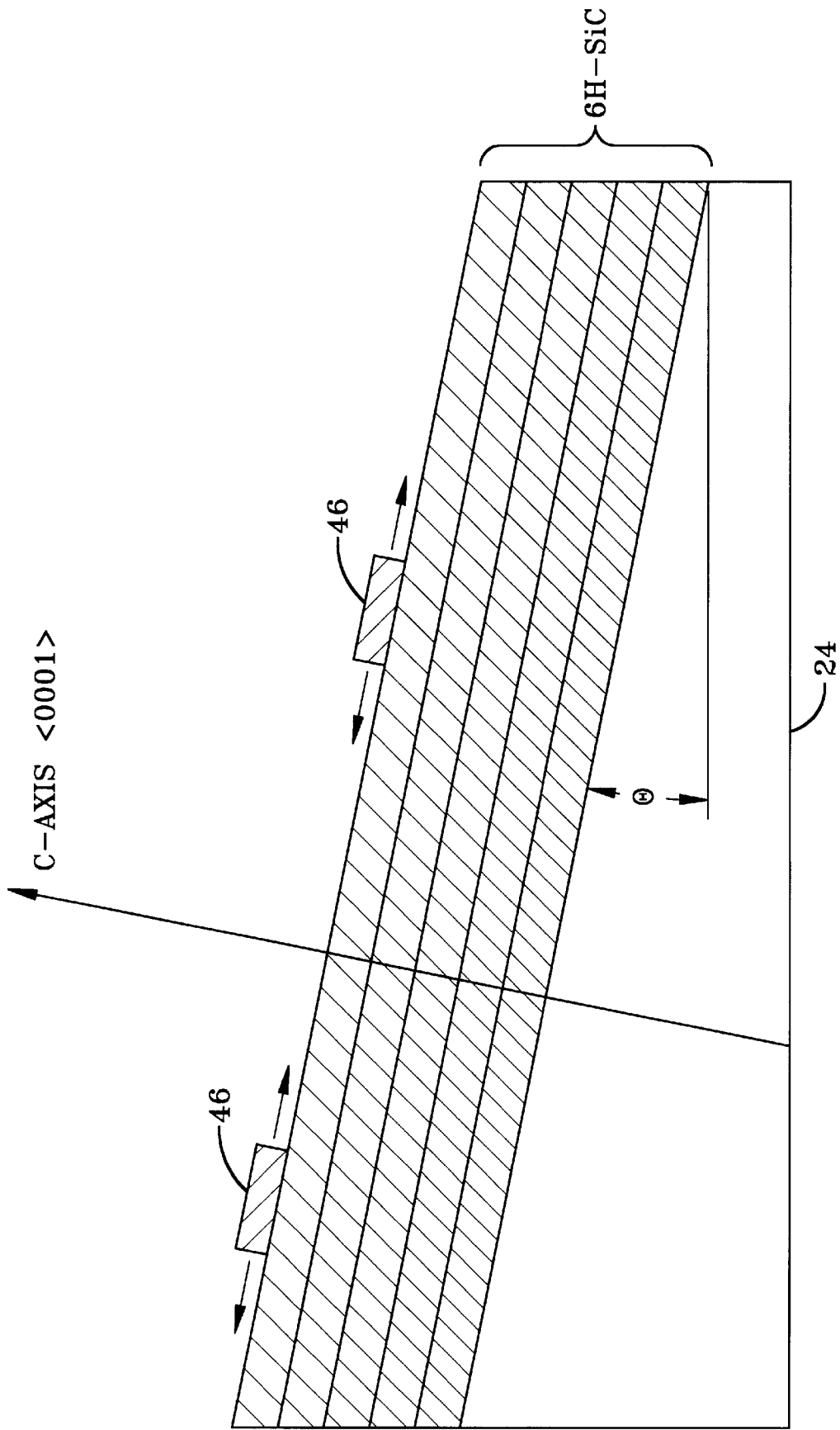
FIG. 7 is a cross-sectional view of a 6H-SiC substrate with two-dimensional nucleation of 3C-SiC islands on the atomically-flat growth surface.
Figure 8:
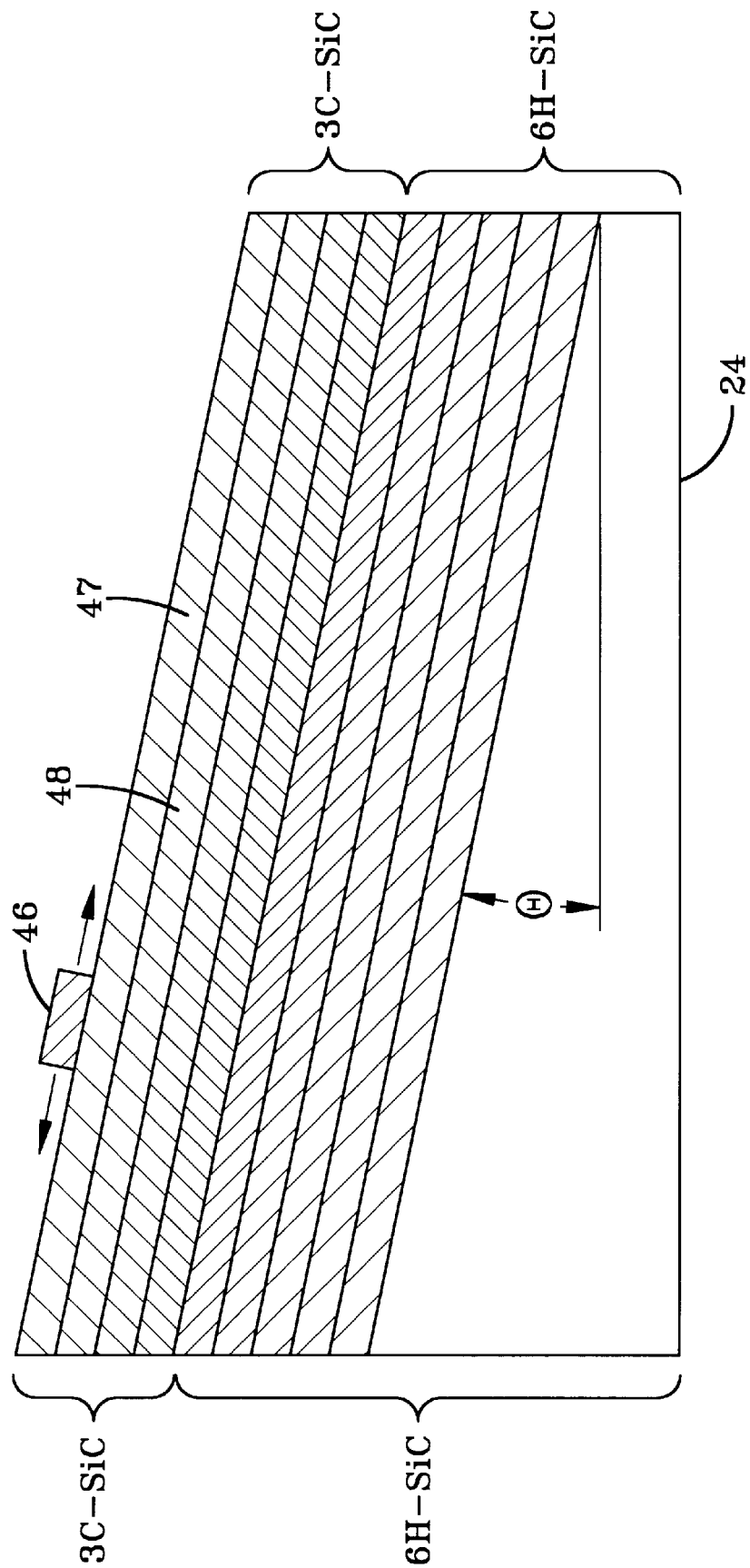
FIG. 8 is the substrate shown in FIG. 7 after growth of a 3C-SiC film using the mechanism of step flow growth with two-dimensional nucleation for the growth of each successive layer.

The heteroepitaxial growth of the desired film can be described by referring now to FIGS. 7 and 8 that illustrate this phase of the growth process, wherein, for one embodiment, 3C-SiC (see FIG. 8) epilayers are grown under conditions that promote two-dimensional nucleation in addition to step-flow growth on substrate 24 made of 6H-SiC (see FIG. 7) with an atomically-flat epilayer surface 45 (see FIG. 6). FIG. 7 illustrates the c-axis <0001> passing through the epilayer 6H-SiC.

The practice of this invention selects the heteroepitaxial film from the group comprising elemental semiconductors, compounds of Group III and Group V elements of the Periodic Table and compounds and alloys of the Group IV elements of the Periodic Table. Further, the selected heteroepitaxial film may be a binary compound (e.g., GaAs, GaP, GaN), a ternary compound (e.g., AlGaAs) or a quaternary compound (e.g., AlGaInP), such as those disclosed in the previously mentioned reference book of Gerald B. Stringfellow.

It is important to the practice of the present invention, and as to be further described hereinafter, to choose a single-crystal substrate material which exhibits the property that the material contains at least one growth plane orientation whereby under selected growth conditions, to be further described, the growth rate due to step-flow growth is at least one hundred (100) times greater than the growth rate due to growth involving two-dimensional nucleation. The proper preparation of the substrate surface includes preparing a growth surface which is approximately parallel to a selected crystal orientation. In the case of SiC, the selected orientation is the (0001) basal plane. In the case of cubic materials (e.g., Si, GaAs and other III–V compounds), one preferred orientation is the (111) plane. Other crystal planes in these and other materials may also be suitable as the growth planes. These materials include, but are not limited to, elemental semiconductors, compounds of Group III and Group V elements of the Periodic Table and compounds and alloys of the Group IV elements of the Periodic Table. Many of these materials have a cubic crystal structure. The nucleation rate for these cubic materials can be affected by the temperature and/or orientation of the crystal growth plane. The growth rate for these materials (and by implication, the nucleation rate) can be reduced to zero, or near zero, in certain growth directions. Also, the polarity of the (111) growth plane (e.g., the (111)As or (111)Ga) can affect the growth rate. Based on the decreased growth rate on growth planes nearly parallel to the (111) plane, a preferred growth plane is the (111) plane for the implementation of this invention with these materials.

Conditions, especially applicable to the 3C-SiC embodiment, that promote two-dimensional nucleation include lower growth temperatures (800 to 1600° C.), higher concentrations of silane and propane, and higher Si/C ratios. Initially, as shown in FIG. 7, there are no atomic-scale steps, so 3C-SiC islands 46 nucleate as shown. These 3C-SiC islands 46 grow laterally by step-flow growth; as the islands 46 coalesce, an atomically-flat 3C-SiC epilayer surface 47 (see FIG. 8) is formed. However, under conditions that promote two-dimensional nucleation, 3C-SiC islands 46 will continue to form on the 3C-SiC epilayers 48. Hence, vertical growth proceeds by step flow with two-dimensional nucleation. Although there is some stress between the two polytype epilayers (3C-SiC and 6H-SiC (see FIG. 8)), the 3C-SiC film layers 48 have no double positioning boundaries (DPBs) and few, if any stacking faults because only one rotational orientation of 3C-SiC epilayer will form on the atomically-flat 6H-SiC substrate in a manner as to be described hereinafter with reference to FIGS. 9–11. The second phase of the growth illustrated in FIGS. 7 and 8 is continued until the desired thickness of 3C-SiC is obtained.

If an atomically-flat final surface on the 3C-SiC epilayer, such as layer 47 of FIG. 8, is desired, then growth conditions near the end of the growth of the desired film are altered to minimize two-dimensional nucleation so that 100-percent step-flow growth produces the desired atomically-flat film surface 47. This atomically-flat film surface 47 on the 3C-SiC epilayer can be used for growth of additional epilayers of other polytypic materials. With this approach, second-phase growth conditions (i.e., two-dimensional nucleation plus step flow) can be used to produce multiple layers of different polytypes. Each polytype will have its own set of second phase growth conditions. Thus, the application of second-phase growth is repeated until the desired multi-layer structure is obtained.

Figure 9:
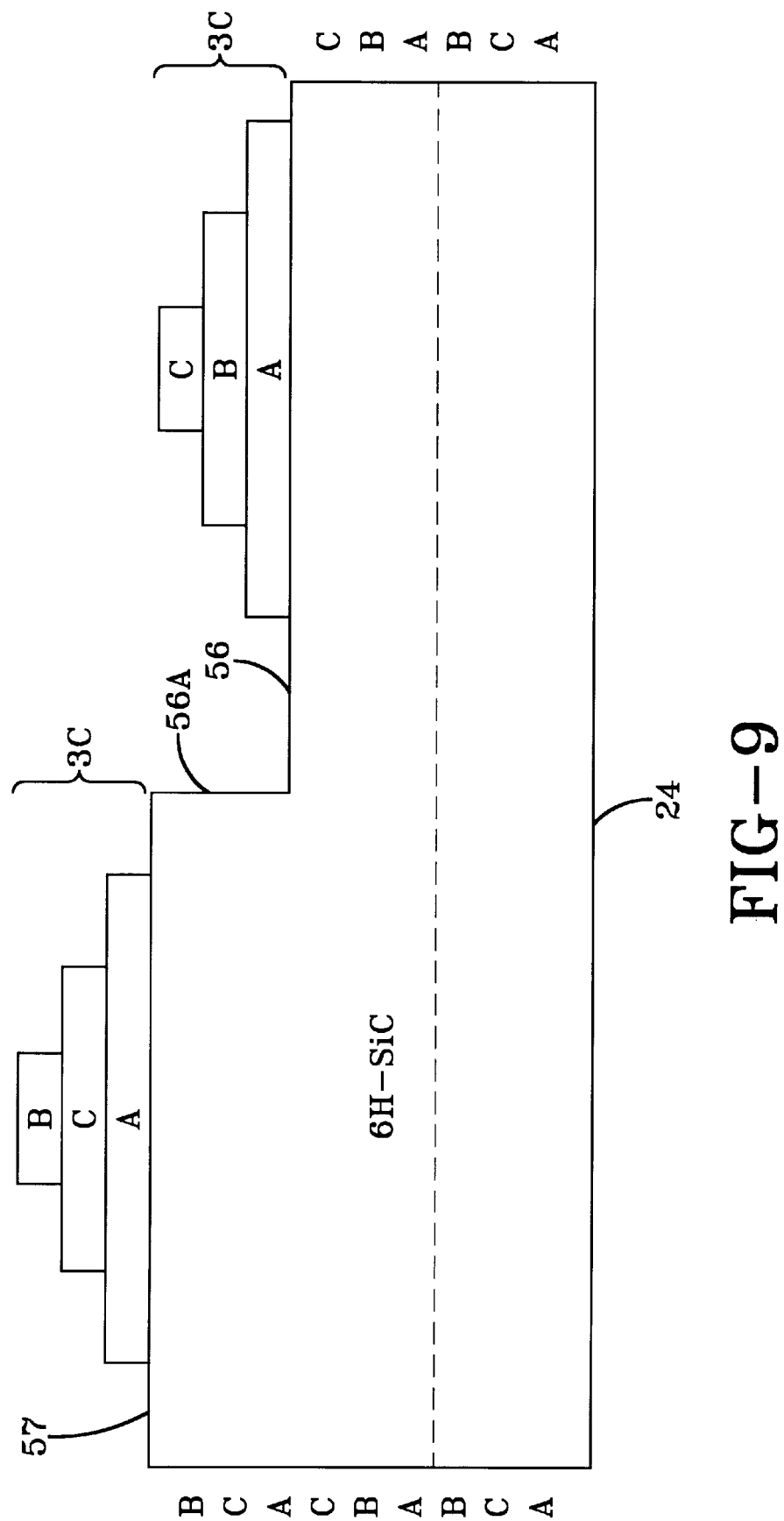
FIG. 9 is a cross-sectional view of a 6H-SiC substrate with an atomic-scale step and which illustrates how two-dimensional nucleation on such a stepped surface leads to the nucleation of 3C-SiC islands with two different rotational orientations.

The rotational orientation for the 3C-SiC embodiment may be further described with reference to FIG. 9 which illustrates schematically how different rotational orientations, such as that of 3C-SiC for one embodiment, can nucleate and grow on a 6H-SiC substrate with steps. As illustrated in FIG. 9, the 3C-SiC orientation ABCABC . . . is formed on the lower terrace 56, while the 3C-SiC orientation ACBACB . . . is formed on the upper terrace 57. The two 3C-SiC orientations ABCABC and ACBACB are rotated 60° with respect to one another and are respectively repeated as shown in FIG. 9 which also illustrates a step 56A between the terraces 56 and 57.

Figure 10:
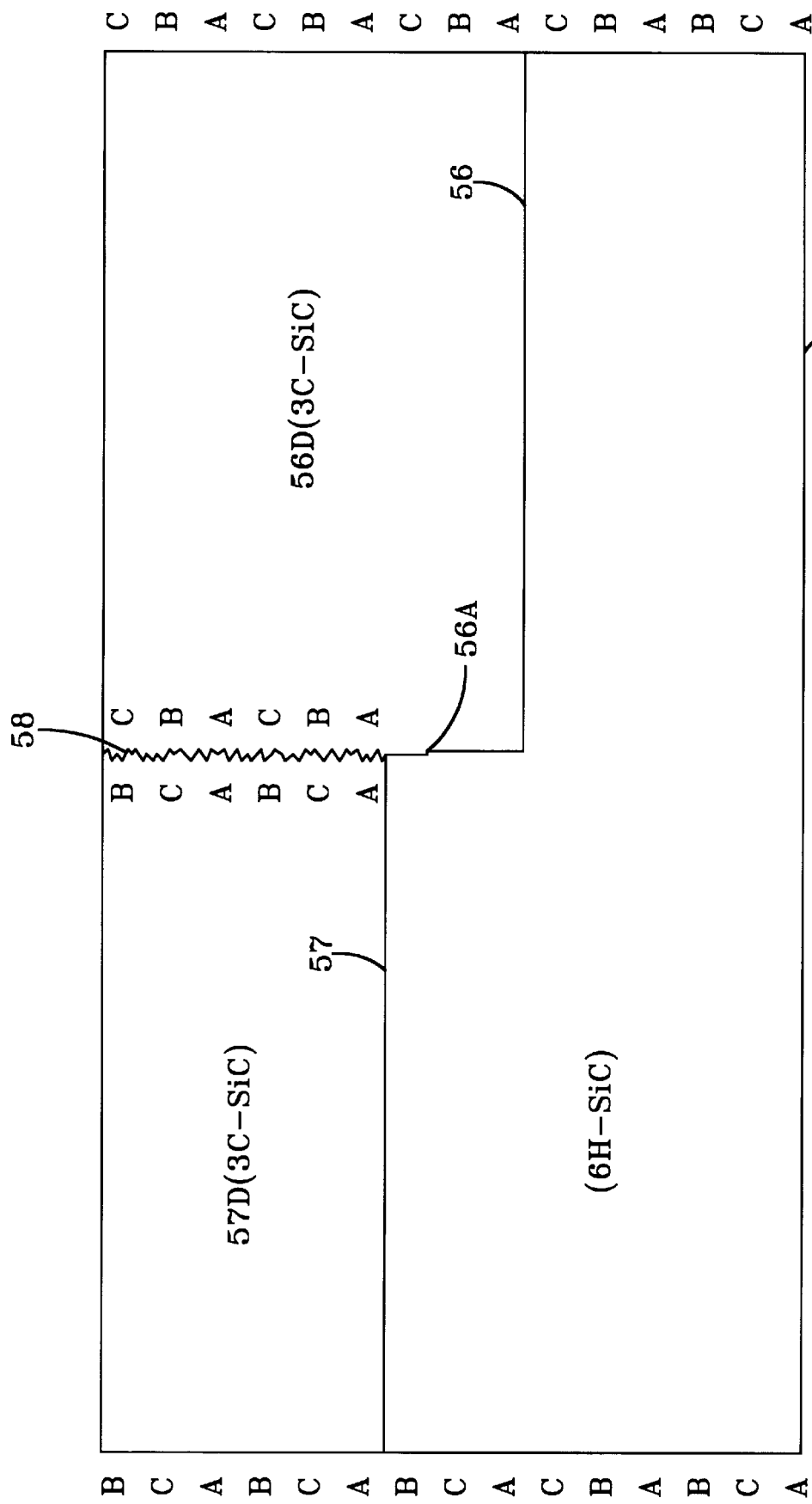
FIG. 10 is a cross-sectional view of the crystal shown in FIG. 9 after additional crystal growth and which shows how a defect known as double positioning boundaries (DPB's) are created when islands with differing rotational orientations grow together.

The double positioning boundaries (DPBs) of the 3C-SiC films of one embodiment of the present invention may be further described with reference to FIG. 10 which illustrates schematically how double positioning boundaries (DPBs) are created when islands, shown as 57D (3C-SiC) and 56D (3C-SiC) located on terraces 57 and 56, respectively grow together. Both of the terraces 56 and 57 are shown as laying on the epilayer 6H-SiC. Two out of three atomic layers do not match-up between islands 57D and 56D. More particularly, only layer A of the orientations ABC and ACB matches up with respect to rotational orientation. Because of this mismatch, double positioning boundaries (DPBs) are created and are shown by the jagged line 58 in FIG. 10. The double positioning boundaries (DPBs) are electrically active and tend to prevent the epitaxial film from being used in a useful controlled manner. The practice of the present invention, as to be more fully described below, eliminates these undesired double positioning boundaries (DPBs).

In the practice of the present invention, in an experimental verification of one important aspect of the invention, a Lely-grown 6H-SiC crystal was used as a substrate 24. A Lely crystal was chosen because this type of SiC crystal generally has much fewer micropipes and dislocations than SiC crystals obtained from sublimation-grown boules. It is desirable to choose substrates with a minimum of defects that can act as sites of unwanted two-dimensional nucleation or unwanted source of steps during the first growth phase of the invention which is the growth of atomically-flat regions. The Si-face surface, such as face 50 of FIG. 3, of this crystal was polished such that the tilt angle of the polished growth surface was approximately 0.33° with respect to the basal plane. An array of 1 millimeter by 1 millimeter square growth mesas was produced on the Lely crystal growth surface by sawing grooves, such as grooves 62 of FIG. 4, approximately 50 micrometers wide by 30 micrometers deep with a dicing saw. A one-hour epitaxial growth was carried out at 1500° C. with this substrate for one embodiment of the present invention, with a Si/C ratio of 0.44 and the result was an atomically-flat, or nearly atomically-flat region, approximately 1 millimeter by 0.5 millimeter, on some of the mesas. There was some evidence of a very thin 3C-SiC epilayer, much less than 1 micrometer thick, on the atomically-flat area. Mesas without atomically-flat regions had large shallow 6H-SiC hillocks caused by step-flow growth from screw dislocations along the edge of the groove 62; most likely these screw dislocations were caused by damage created by the dicing saw blade. This result demonstrates that, for substrates without screw dislocations and other significant defects, device-sized atomically-flat regions can be grown under the proper growth conditions. Subsequent epitaxial growth on this substrate, such as substrate 24 of FIG. 1, produced, for one embodiment of the present invention, thicker 3C-SiC epilayers with no double positioning boundaries (DPBs, such as those of FIG. 10), and dramatically reduced stacking fault density. On one of the mesas, the 3C-SiC film of one embodiment had no stacking faults and it is anticipated that the other embodiments of the present invention utilizing a heteroepitaxial film selected from the remainder of the group comprising elemental semiconductors, compounds of Group III and Group V elements of the Periodic Table and compounds and alloys of the Group IV elements of the Periodic Table will also manifest no stacking faults. This result demonstrates that 3C-SiC epilayers grown on atomically-flat substrates in accordance with one of the embodiments of the present invention have much lower defect density than 3C-SiC epilayers grown by prior art processes.

In the practice of the present invention an experimental observation was performed to verify another important aspect of the invention. Epitaxial growth of the 3C-SiC epilayers of one embodiment of the present invention was carried out on a 6H-SiC substrate that was obtained from a sublimation-grown boule. This substrate was polished on the Si face, such as face 50 of FIG. 3, and had a growth surface with a tilt angle of about 0.2° with respect to the basal plane. This substrate, such as substrate 24 of FIG. 1, also had a high density of screw dislocations since it was a boule-derived sample. The resulting epitaxial film had numerous shallow hillocks produced by step-flow growth of new steps emanating from the screw dislocation as the film grew and which may be further described with reference to FIG. 11.

Figure 11:
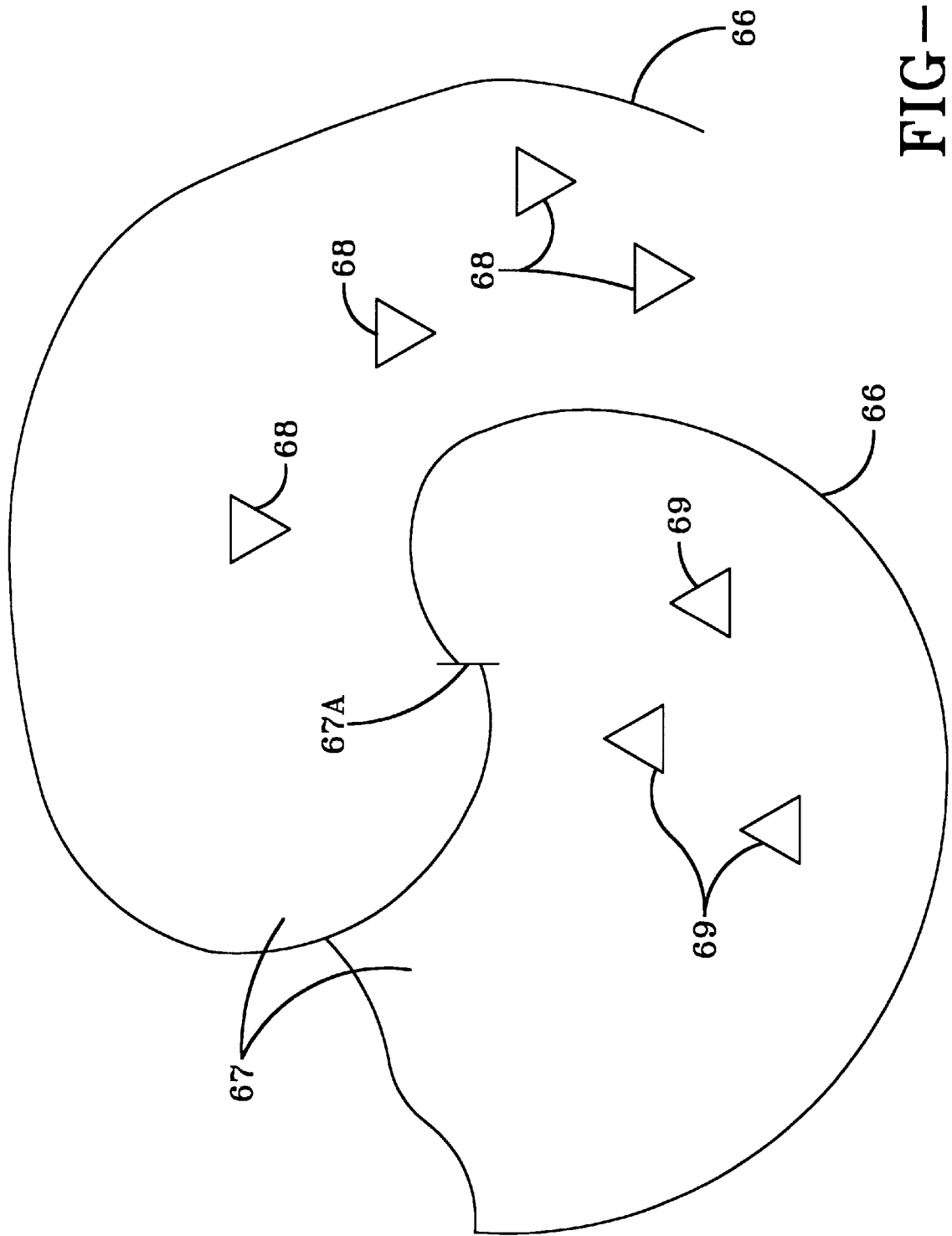
FIG. 11 is drawing of two-dimensional nucleation of 3C-SiC islands observed on adjacent basal-plane terraces on a 6H-SiC crystal where the spiral growth steps are produced by a screw dislocation in the 6H-SiC crystal. Islands on the same terrace have the same rotational orientation.

FIG. 11 illustrates a plurality of spiral growth steps 66 interconnected at the center 67A and seen with atomic force microscopy (AFM) in the vicinity of the screw dislocation previously discussed. The spiral lines 66 are growth steps, 0.75 nm high (the c-axis repeat distance of 3C-SiC), separating adjacent spiral terraces 67. Each spiral terrace 67 is substantially atomically-flat. FIG. 11 shows a plurality of triangle symbols that represent 3C-SiC islands 68 and 69. As seen in FIG. 11, all islands 68 on the same terrace 67 have the same orientation and, similarly all islands 69 on the same terrace 67 have the same orientations. Conversely, the islands 68 and 69 are rotated 180° with respect to each other; 3C-SiC islands 68 and 69 have nucleated on the atomically-flat terraces 67 due to the particular growth conditions. The orientation of the triangles 68 and 69 shown in FIG. 11 is an indicator of the orientation of the 3C-SiC island 68 or 69. From FIG. 11, in particularly illustrated islands 68 and 69, it may be concluded that all 3C-SiC epilayers that nucleates on an atomically-flat growth surface will have the same rotational orientation under proper growth conditions.

It is contemplated that the present invention is applicable to commercially available boule-derived wafers because the micropipe and dislocation density of the commercial wafer is steadily being reduced as was the case for silicon wafers many years ago. In a paper entitled "Recent Progress in SiC Crystal Growth," presented by V. F. Tsvetkov, et al of Cree Research, Inc., at the Silicon Carbide and Related Materials 1995 Conf., in Kyoto, Japan, it was reported that the micropipe and dislocation densities in their laboratory 6H-SiC wafers have been reduced by about 10× in the last several years. Hence, as this trend continues, the commercial wafers should be very suitable substrates.

The hereinbefore given description of FIGS. 7–11 was directed to one embodiment of the present invention, that is, a heteroepitaxial film of 3C-SiC grown on a 6H-SiC substrate. However, the present invention not only provides a heteroepitaxial film comprising SiC, but also allows the heteroepitaxial film to be selected from the remainder of the group comprising elemental semiconductors, compounds of Group III and Group V elements of the Periodic Table and compounds and alloys of the Group IV elements of the Periodic Table. Further, the present invention not only provides a crystal substrate formed of SiC, but also provides crystal substrates formed of a material selected from the group comprising elemental semiconductors, compounds of Group III and Group V elements of the Periodic Table and compounds and alloys of the Group IV elements of the Periodic Table. Semiconductors making up films and substrates of the compounds, such as GaAs, GaP and GaN, formed from elements of Group III and Group V elements of the Periodic Table and compounds and alloys of the Group IV elements of the Periodic Table have been grown and used for many years. Their properties and procedures of crystal growth are known to those skilled in the art and are disclosed, for example, in the reference book of Gerald B. Stringfellow that describes in detail the epitaxial growth of III–V compounds. In this book, Chapter 1 gives an overview of epitaxial growth processes wherein organometallic vapor phase epitaxy (OMVPE) is primarily used to grow III–V compounds. The growth of binary compounds (e.g., GaAs, GaP, GaN, etc.), ternary compounds (e.g., AlGaAs, etc.), and quaternary compounds (e.g., AlGaInP, etc.) is described in Chapter 7. Further, the previously mentioned article of H. Morkoc et al gives details of the properties (p. 1378, 1380) and epitaxial growth (1380–1382) of the III-nitrides. FIG. 30 of the technical article illustrates a schematic diagram of a CVD reactor, having many of the features as that of FIG. 1 of the present invention, for growing GaN which formed from the elements of Group III and Group V of the Periodic Table.

Still further, Sections 5.1 and 5.3 of the previously incorporated by reference publication of Sorab K. Ghandhi describe growth of Si and GaAs. More particularly, Section 5.1 describes various phases of vapor phase epitaxy, including various epitaxial reactor configurations that are used in the growth of Si and GaAs. Section 5.3 describes the growth of GaAs, including the effect of crystal orientation (Section 5.3.7). In particular, FIG. 5.19 shows the strong dependence of orientation on the growth rate which is in agreement with the practice of the present invention.

By following the conventional techniques known in the art, substrates as well as heteroepitaxial films, such as AlN and GaN may be formed on the substrates specially prepared in accordance to the present invention to yield low-defect films. These are important optoelectronic and high temperature and high frequency electronic materials. In fact, research on these nitrides has expanded dramatically over the last several years because of their potential use in the fabrication of short-wavelength diode lasers in a manner as described in the "Background" Section.

The invention can be readily applied to the growth of AlN and/or GaN on SiC substrates because these nitrides are fairly closely lattice-matched to SiC. The process of the present invention can be modified for nitride growth in the following manner. The substrate can be 6H-SiC, and can be processed as was described for the growth of 3C-SiC. All process procedures up through the growth of atomically-flat 6H-SiC epilayers would be carried out. More particularly, all of the hereinbefore given description of FIGS. 1–7 is followed to establish an atomically flat 6H-SiC substrate. Then, the procedures that are known to those skilled in the art of nitride growth are applied to the specially prepared 6H-SiC substrate with atomically-flat regions. More particularly, the conventional techniques such as those of Gerald B. Stringfellow, H. Morkoc et al and/or Sorab K. Ghandhi are followed for the epitaxial growth of the heteroepitaxial film selected from the group comprising elemental semiconductors, compounds of Group III and Group V elements of the Periodic Table and compounds and alloys of the Group IV elements of the Periodic Table. The description of FIGS. 7–10 related to the heteroepitaxial film of SiC is also applicable to the heteroepitaxial film selected from the group comprising elemental semiconductors, compounds of Group III and Group V elements of the Periodic Table and compounds and alloys of the Group IV elements of the Periodic Table. The advantage of the atomically-flat growth surfaces provided by the practice of the present invention is that the nitride islands that nucleate will have the same orientation, rather than random orientations that occurs in growth on substrates with atomic-scale steps. The description of FIG. 11 related to the heteroepitaxial film of SiC is also applicable to the heteroepitaxial film selected from the group comprising elemental semiconductors, compounds of Group III and Group V elements of the Periodic Table and compounds and alloys of the Group IV elements of the Periodic Table. There are various combinations of growth procedures that can be used. For example, AlN, GaN, or AlGaN could be grown directly on the atomically-flat 6H-SiC mesas, or AlN could be used as a buffer layer between a GaN epilayer and the 6H-SiC substrate. In either case, the defect density in the nitride epilayers should be significantly lower than obtainable in epilayers grown by prior processes on commercially available SiC or sapphire substrates.

As is known in the art, it is common practice to insert additional heteroepitaxial layers that serve as buffer layers to reduce stress and defects between heteroepitaxial films. AlN and AlGaN are examples of buffer layers used for growth of GaN on SiC and sapphire.

As hereinbefore described, the material selected for the substrate should exhibit the property that the material contains at least one growth plane orientation, whereby under selected growth conditions the growth rate due to step-flow growth is greater than at least one hundred (100) times the growth rate due to growth involving two-dimensional nucleation. These other materials include, but are not limited to, elemental semiconductors, compounds of Group III and Group V elements of the Periodic Table and compounds and alloys of the Group IV elements of the Periodic Table. Many of these materials have a cubic crystal structure. As hereinbefore described, the nucleation rate for these cubic materials can be affected by the temperature and/or orientation of the crystal growth plane. Further, as hereinbefore described, the growth rate for these materials (and by implication, the nucleation rate) can be reduced to zero, or near zero, in certain growth directions. Also, the polarity of the (111) growth plane (e.g., the (111)As or (111)Ga) can affect the growth rate. Based on the decreased growth rate on growth planes nearly parallel to the (111) plane, a preferred growth plane is the (111) plane for the practice of this invention with these materials. As mentioned previously for SiC, a preferred growth plane is one approximately parallel to the (0001) basal plane, and a preferred method of reducing the two-dimensional nucleation rate during growth is to increase the growth temperature above that required for epitaxial growth involving two-dimensional nucleation. For the case of Si, a preferred growth plane is one approximately parallel to the (111) plane, and a preferred method of reducing the two-dimensional nucleation to near zero during growth is also to grow at tempeatures higher than is required for normal epitaxial growth involving two-dimensional growth. This same approach can be used for many other materials that have a cubic structure and are compounds of the Group III and Group V elements of the Periodic Table or are compounds or alloys of the Group IV elements of the Periodic Table.

An advantage of epilayers grown with this invention is that the epilayer surfaces on each growth region are atomically-flat or nearly atomically-flat. In contrast, epilayers grown on SiC substrates using prior art processes result in surface with larger surface steps (tens of nanometers high) formed by the "step bunching" of smaller atomic-scale steps (approximately 1 nanometer high).

The practice of this invention produces, among other things, semiconductor or laser devices having one or more heteroepitaxial films of atomically-flat surfaces on a SiC substrate. The atomically-flat surfaces are provided by the practice of the present invention and the related semiconductor devices have other characteristics, structures and operations known in the art such as described in the five (5) reference books/publications of the previously mentioned authors Ralph E. Williams; F. Ali and A. Gupta, D. K. Schroder, R. C. Jaeger, and S. M. Sze.

The invention has been described with reference to a preferred embodiment and alternates thereof. It is believed that many modifications and alterations to the embodiment as discussed herein will readily suggest themselves to those skilled in the art upon reading and understanding the detailed description of the invention. It is intended to include all such modifications and alterations insofar as they come within the scope of the present invention.

What we claim is:

1. A method of producing single-crystal atomically-flat surfaces on a single-crystal substrate, said method comprising the steps of:
    (a) choosing a single-crystal substrate material which exhibits the property that the material contains at least one growth plane orientation whereby under selected growth conditions the growth rate due to step-flow growth is greater than at least one hundred (100) times the growth rate due to growth involving two-dimensional nucleation;
    (b) preparing a planar growth surface on said substrate that is parallel to within a predetermined angle relative to said at least one growth plane orientation of said substrate;
    (c) removing material in said substrate so as to define at least one selected separated area having boundaries;
    (d) treating said substrate so as to remove any sources of unwanted crystal nucleation and to remove any unwanted sources of steps;
    (e) depositing a homoepitaxial film over said at least one selected separated area under selected conditions so as to provide a step-flow growth while suppressing two-dimensional nucleation; and
    (f) continuing said deposition of said homoepitaxial film until said step-flow growth obtains an atomically-flat epitaxial film surface on each of said at least one separated area where said atomically-flat surface is parallel to said selected crystal plane.

2. The method according to claim 1, wherein said single-crystal material is selected from the group comprising elemental semiconductors, compounds of Group III and Group V elements of the Periodic Table and compounds and alloys of the Group IV elements of the Periodic Table.

3. The method according to claim 2, wherein said selected material has a cubic crystal structure.

4. The method according to claim 3, wherein said at least one growth plane orientation is within one (1) degree of the (111) plane.

5. A method of producing multiple heteroepitaxial films of atomically-flat surfaces on a single-crystal substrate, said method comprising the steps of:
    (a) choosing a single-crystal substrate material which exhibits the property that the material contains at least one growth plane orientation whereby under selected growth conditions the growth rate due to step-flow growth is greater than at least one hundred (100) times the growth rate due to growth involving two-dimensional nucleation;
    (b) preparing a planar growth surface on said substrate that is parallel to within a predetermined angle relative to said at least one growth plane orientation of said substrate;
    (c) removing material in said substrate so as to define at least one selected separated area having boundaries;
    (d) treating said substrate so as to remove any sources of unwanted crystal nucleation and remove any unwanted sources of steps;
    (e) depositing a homoepitaxial film over said at least one selected separated area under selected conditions so as to provide a step-flow growth while suppressing two-dimensional nucleation;
    (f) continuing said deposition of said homoepitaxial film until said step-flow growth obtains an atomically-flat epitaxial film surface on each of said at least one separated area where said atomically-flat surface is parallel to said selected crystal plane;
    (g) depositing a desired heteroepitaxial film selected from the group comprising elemental semiconductors, compounds of Group III and Group V elements of the Periodic Table and compounds and alloys of the Group IV elements of the Periodic Table on said homoepitaxial film under predetermined conditions that preferably cause two-dimensional nucleation accompanied by step-flow growth of said desired heteroepitaxial film;

(h) continuing said depositing of said step (g) of said heteroepitaxial film until a desired thickness is obtained;

(i) continuing the growth of the said heteroepitaxial film under selected conditions so as to provide a step flow growth while suppressing two-dimensional nucleation;

(j) continuing said deposition of said heteroepitaxial film until said step-flow growth obtains an atomically-flat epitaxial film surface on each of said at least one separated area where said atomically-flat surface is parallel to said selected crystal plane;

(l) repeating step (g);

(m) repeating step (h);

(n) repeating step (i);

(o) repeating step (j); and (p) repeating steps (l), (m), (n), and (o) until desired multiple heteroepitaxial film structure is obtained.

6. The method according to claim 5, wherein said substrate is of a material selected from the group comprising elemental semiconductors, compounds of Group III and Group V elements of the Periodic Table and compounds and alloys of the Group IV elements of the Periodic Table.

7. The method according to claim 1, wherein said multiple heteroepitaxial films comprise adjacent layers that are brought together with a buffer layer that reduces the stress between adjacent layers.

8. The method according to claim 7, wherein said buffer layer is a material selected from the group comprising AlN, AlGaN, and GaN.

9. The method according to claim 5, wherein the said heteroepitaxial film is one of a binary, a ternary, and quaternary semiconductor compound of the Group III and Group V elements.

10. A method of producing a semiconductor device having single-crystal atomically-flat surfaces on a single-crystal substrate, said method comprising the steps of:

(a) choosing a single-crystal substrate material which exhibits the property that the material contains at least one growth plane orientation whereby under selected growth conditions the growth rate due to step-flow growth is greater than at least one hundred (100) times the growth rate due to growth involving two-dimensional nucleation;

(b) preparing a planar growth surface on said substrate that is parallel to within a predetermined angle relative to said at least one growth plane orientation of said substrate;

(c) removing material in said substrate so as to define at least one selected separated area having boundaries;

(d) treating said substrate so as to remove any sources of unwanted crystal nucleation and remove any unwanted sources of steps;

(e) depositing a homoepitaxial film over said at least one selected separated area under selected conditions so as to provide a step-flow growth while suppressing two-dimensional nucleation; and (f) continuing said deposition of said homoepitaxial film until said step-flow growth obtains an atomically-flat epitaxial film surface on each of said at least one separated area where said atomically-flat surface is parallel to said selected crystal plane.

11. The method according to claim 10, wherein said substrate is of a material selected from the group comprising elemental semiconductors, compounds of Group III and Group V elements of the Periodic Table and compounds and alloys of the Group IV elements of the Periodic Table.

12. A method of producing a semiconductor device having a heteroepitaxial film of atomically-flat surfaces on a single-crystal substrate, said method comprising the steps of:

(a) choosing a single-crystal substrate material which exhibits the property that the material contains at least one growth plane orientation whereby under selected growth conditions the growth rate due to step-flow growth is greater than at least one hundred (100) times the growth rate due to growth involving two-dimensional nucleation;

(b) preparing a planar growth surface on said substrate that is parallel to within a predetermined angle relative to said at least one growth plane orientation of said substrate;

(c) removing material in said substrate so as to define at least one selected separated area having boundaries;

(d) treating said substrate so as to remove any sources of unwanted crystal nucleation and remove any unwanted sources of steps;

(e) depositing a homoepitaxial film over said at least one selected separated area under selected conditions so as to provide a step-flow growth while suppressing two-dimensional nucleation;

(f) continuing said deposition of said homoepitaxial film until said step-flow growth obtains an atomically-flat epitaxial film surface on each of said at least one separated area where said atomically-flat surface is parallel to said selected crystal plane;

(g) depositing a desired heteroepitaxial film selected from the group comprising elemental semiconductors, compounds of Group III and Group V elements of the Periodic Table and compounds and alloys of the Group IV elements of the Periodic Table on said homoepitaxial film under predetermined conditions that preferably cause two-dimensional nucleation accompanied by step-flow growth of said desired heteroepitaxial film; and (h) continuing said depositing of said step (f) of said heteroepitaxial film until a desired thickness is obtained.

13. The method according to claim 12, wherein said substrate is of a material selected from the group comprising elemental semiconductors, compounds of Group III and Group V elements of the Periodic Table and compounds and alloys of the Group IV elements of the Periodic Table.

14. A method of producing a semiconductor device having multiple heteroepitaxial films of atomically-flat surfaces on a single-crystal substrate, said method comprising the steps of:

(a) choosing a single-crystal substrate material which exhibits the property that the material contains at least one growth plane orientation whereby under selected growth conditions the growth rate due to step-flow growth is greater than at least one hundred (100) times the growth rate due to growth involving two-dimensional nucleation;

(b) preparing a planar growth surface on said substrate that is parallel to within a predetermined angle relative to said at least one growth plane orientation of said substrate;

(c) removing material in said substrate so as to define at least one selected separated area having boundaries;

(d) treating said substrate so as to remove any sources of unwanted crystal nucleation and remove any unwanted sources of steps;

(e) depositing a homoepitaxial film over said at least one selected separated area under selected conditions so as to provide a step-flow growth while suppressing two-dimensional nucleation;

(f) continuing said deposition of said homoepitaxial film until said step-flow growth obtains an atomically-flat epitaxial film surface on each of said at least one separated area where said atomically-flat surface is parallel to said selected crystal plane;

(g) depositing a desired heteroepitaxial film selected from the group comprising elemental semiconductors, compounds of Group III and Group V elements of the Periodic Table and compounds and alloys of the Group IV elements of the Periodic Table on said homoepitaxial film under predetermined conditions that preferably cause two-dimensional nucleation accompanied by step-flow growth of said desired heteroepitaxial film;

(h) continuing said depositing of said step (g) of said heteroepitaxial film until a desired thickness is obtained;

(i) continuing the growth of the said heteroepitaxial film under selected conditions so as to provide a step flow growth while suppressing two-dimensional nucleation;

(j) continuing said deposition of said heteroepitaxial film until said step-flow growth obtains an atomically-flat epitaxial film surface on each of said at least one separated area where said atomically-flat surface is parallel to said selected crystal plane;

(k) repeating step (g);

(l) repeating step (h);

(m) repeating step (i);

(n) repeating step (j); and (o) repeating steps (k), (l), (m), and (n) until desired multiple heteroepitaxial film structure of said semiconductor device is obtained.

15. The method according to claim 14, wherein said substrate is of a material selected from the group comprising elemental semiconductors, compounds of Group III and Group V elements of the Periodic Table and compounds and alloys of the Group IV elements of the Periodic Table.

16. A method of producing a laser diode having multiple heteroepitaxial films of atomically-flat surfaces on a single-crystal substrate, said method comprising the steps of:

(a) choosing a single-crystal substrate material which exhibits the property that the material contains at least one growth plane orientation whereby under selected growth conditions the growth rate due to step-flow growth is greater than at least one hundred (100) times the growth rate due to growth involving two-dimensional nucleation;

(b) preparing a planar growth surface on said substrate that is parallel to within a predetermined angle relative to a selected crystal plane of said substrate;

(c) removing material in said substrate so as to define at least one selected separated area having boundaries;

(d) treating said substrate so as to remove any sources of unwanted crystal nucleation and remove any unwanted sources of steps;

(e) depositing a homoepitaxial film over said at least one selected separated area under selected conditions so as to provide a step-flow growth while suppressing two-dimensional nucleation;

(f) continuing said deposition of said homoepitaxial film until said step-flow growth obtains an atomically-flat epitaxial film surface on each of said at least one separated area where said atomically-flat surface is parallel to said selected crystal plane;

(g) depositing a desired heteroepitaxial film selected from the group comprising elemental semiconductors, compounds of Group III and Group V elements of the Periodic Table and compounds and alloys of the Group IV elements of the Periodic Table on said homoepitaxial film under predetermined conditions that preferably cause two-dimensional nucleation accompanied by step-flow growth of said desired heteroepitaxial film;

(h) continuing said depositing of said step (g) of said heteroepitaxial film until a desired thickness is obtained;

(i) continuing the growth of the said heteroepitaxial film under selected conditions so as to provide a step flow growth while suppressing two-dimensional nucleation;

(j) continuing said deposition of said heteroepitaxial film until said step-flow growth obtains an atomically-flat epitaxial film surface on each of said at least one separated area where said atomically-flat surface is parallel to said selected crystal plane;

(k) repeating step (g);

(l) repeating step (h);

(m) repeating step (i);

(n) repeating step (j); and (o) repeating steps (k), (l), (m), and (n) until desired multiple heteroepitaxial film structure for said laser diode is obtained.

17. The method according to claim 16, wherein said substrate is of a material selected from the group comprising elemental semiconductors, compounds of Group III and Group V elements of the Periodic Table and compounds and alloys of the Group IV elements of the Periodic Table.

* * * * *